United States Patent
Chen et al.

(10) Patent No.: US 8,389,971 B2
(45) Date of Patent: *Mar. 5, 2013

(54) MEMORY CELLS HAVING STORAGE ELEMENTS THAT SHARE MATERIAL LAYERS WITH STEERING ELEMENTS AND METHODS OF FORMING THE SAME

(75) Inventors: Yung-Tin Chen, Santa Clara, CA (US); Chuanbin Pan, Sunnyvale, CA (US); Andrei Mihnea, San Jose, CA (US); Steven Maxwell, Sunnyvale, CA (US); Kun Hou, Milpitas, CA (US)

(73) Assignee: SanDisk 3D LLC, Milpitas, CA (US)

( * ) Notice: Subject to any disclaimer, the term of this patent is extended or adjusted under 35 U.S.C. 154(b) by 183 days.

This patent is subject to a terminal disclaimer.

(21) Appl. No.: 12/905,047

(22) Filed: Oct. 14, 2010

(65) Prior Publication Data

US 2012/0091419 A1    Apr. 19, 2012

(51) Int. Cl.
*H01L 47/00* (2006.01)

(52) U.S. Cl. .................. 257/4; 257/2; 257/E45.002

(58) Field of Classification Search .............. 257/2, 4, 257/314, E45.002
See application file for complete search history.

(56) References Cited

U.S. PATENT DOCUMENTS

| | | | |
|---|---|---|---|
| 4,954,455 A | 9/1990 | Wanderman et al. |
| 5,915,167 A | 6/1999 | Leedy |
| 6,343,032 B1 | 1/2002 | Black et al. |
| 6,509,601 B1 | 1/2003 | Lee et al. |
| 6,542,000 B1 | 4/2003 | Black et al. |
| 6,952,030 B2 | 10/2005 | Herner et al. |
| 7,026,689 B2 | 4/2006 | Liaw |
| 7,176,064 B2 | 2/2007 | Herner |
| 7,251,152 B2 | 7/2007 | Roehr |
| 7,319,053 B2 | 1/2008 | Subramanian et al. |
| 7,532,497 B2 | 5/2009 | Kinoshita |
| 7,629,198 B2 | 12/2009 | Kumar et al. |
| 7,648,896 B2 | 1/2010 | Herner |
| 7,668,002 B2 | 2/2010 | Kinoshita et al. |
| 7,678,607 B2 | 3/2010 | Chiang et al. |
| 7,714,313 B2 | 5/2010 | Lee et al. |
| 7,767,499 B2 | 8/2010 | Herner |
| 7,808,810 B2 | 10/2010 | Herner |

(Continued)

FOREIGN PATENT DOCUMENTS

| | | |
|---|---|---|
| EP | 2 048 713 | 4/2009 |
| EP | 2 099 072 | 9/2009 |

(Continued)

OTHER PUBLICATIONS

U.S. Appl. No. 12/904,770, filed Oct. 14, 2010.

(Continued)

*Primary Examiner* — Michelle Mandala
(74) *Attorney, Agent, or Firm* — Dugan & Dugan, PC

(57) ABSTRACT

In some embodiments, a memory cell is provided that includes a storage element formed from an MIM stack including (1) a first conductive layer; (2) an RRS layer formed above the first conductive layer; and (3) a second conductive layer formed above the RRS layer, at least one of the first and second conductive layers comprising a first semiconductor material layer. The memory cell includes a steering element coupled to the storage element, the steering element formed from the first semiconductor material layer of the MIM stack and one or more additional material layers. Numerous other aspects are provided.

51 Claims, 17 Drawing Sheets

U.S. PATENT DOCUMENTS

| | | | |
|---|---|---|---|
| 7,812,404 B2 | 10/2010 | Herner et al. | |
| 8,179,711 B2 * | 5/2012 | Kim et al. | 365/148 |
| 2002/0064069 A1 * | 5/2002 | Goebel et al. | 365/173 |
| 2006/0250836 A1 | 11/2006 | Herner et al. | |
| 2007/0069241 A1 | 3/2007 | Yang et al. | |
| 2007/0132049 A1 | 6/2007 | Stipe | |
| 2007/0165434 A1 | 7/2007 | Lee et al. | |
| 2007/0228414 A1 | 10/2007 | Kumar et al. | |
| 2007/0246764 A1 | 10/2007 | Herner | |
| 2008/0003793 A1 | 1/2008 | Herner et al. | |
| 2008/0070162 A1 * | 3/2008 | Ufert | 430/290 |
| 2008/0170428 A1 | 7/2008 | Kinoshita | |
| 2008/0210924 A1 | 9/2008 | Shin | |
| 2008/0211036 A1 | 9/2008 | Zhao et al. | |
| 2008/0278990 A1 | 11/2008 | Kumar | |
| 2008/0304308 A1 | 12/2008 | Stipe | |
| 2009/0026434 A1 | 1/2009 | Malhotra et al. | |
| 2009/0140229 A1 | 6/2009 | Sandoval | |
| 2009/0236581 A1 | 9/2009 | Yoshida et al. | |
| 2009/0303780 A1 | 12/2009 | Kasko et al. | |
| 2010/0038791 A1 | 2/2010 | Lee et al. | |
| 2010/0110757 A1 | 5/2010 | Ma et al. | |
| 2010/0110765 A1 | 5/2010 | Tian et al. | |
| 2010/0118590 A1 | 5/2010 | Carter et al. | |
| 2010/0230655 A1 | 9/2010 | Noshiro | |
| 2010/0243983 A1 | 9/2010 | Chiang et al. | |
| 2010/0315857 A1 | 12/2010 | Sonehara et al. | |

FOREIGN PATENT DOCUMENTS

| | | |
|---|---|---|
| EP | 2 113 943 A2 | 11/2009 |
| WO | WO 2008/154359 | 12/2008 |
| WO | WO 2009/050861 | 4/2009 |
| WO | WO 2010/004705 | 1/2010 |
| WO | WO 2010/062309 | 6/2010 |

OTHER PUBLICATIONS

U.S. Appl. No. 12/904,802, filed Oct. 14, 2010.
U.S. Appl. No. 13/047,020, filed Mar. 14, 2011.
U.S. Appl. No. 13/047,098, filed Mar. 14, 2011.
Roberston et al., "Fermi level pinning by defects in HfO2-metal gate stacks," Appl. Phys. Letters 91, 132912 (2007) (from 410 and 431 spec).
T-J. King, K. Saraswat, "A Low-Temperature (5 SSOOC) Silicon-Germanium MOS Thin-Film Transistor Technology for Large-Area Electronics", IEDM 1991. (from 410 ID).
Chen et al., "Non-volatile resistive switching for advanced memory applications:", IEDM Technical Digest 2005, IEEE, 2005, pp. 746-749.

* cited by examiner

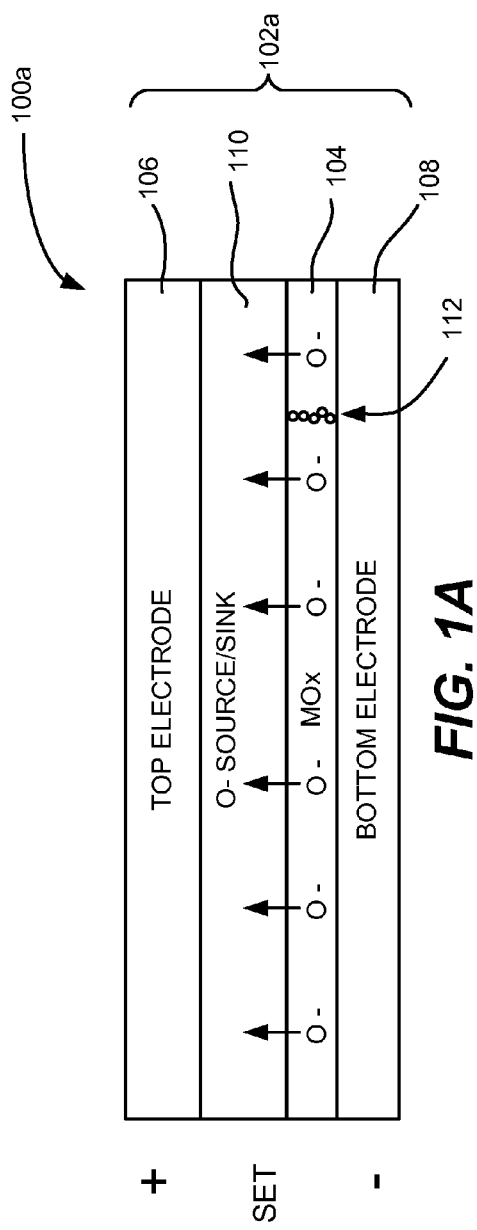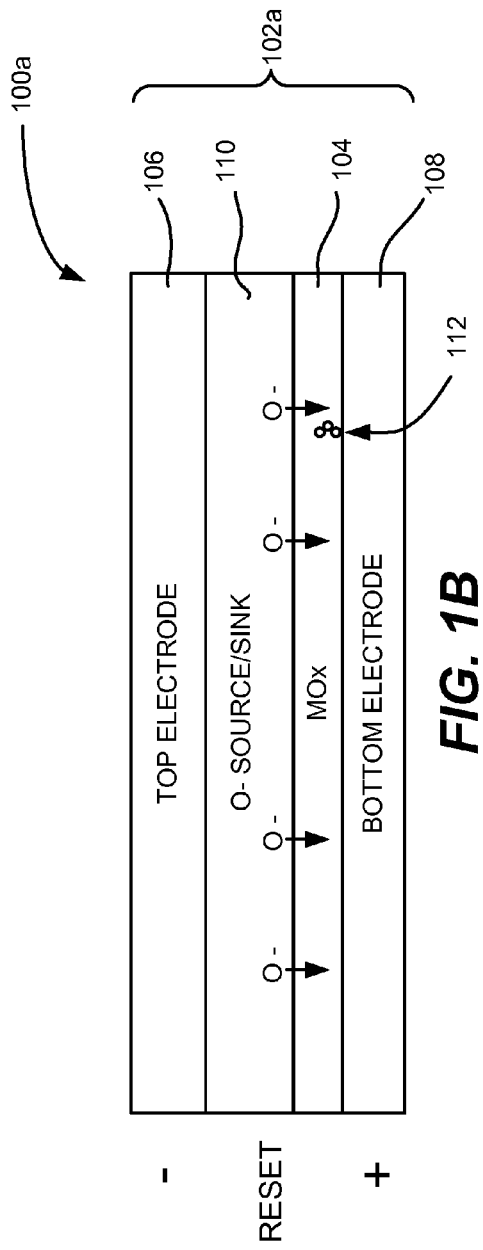

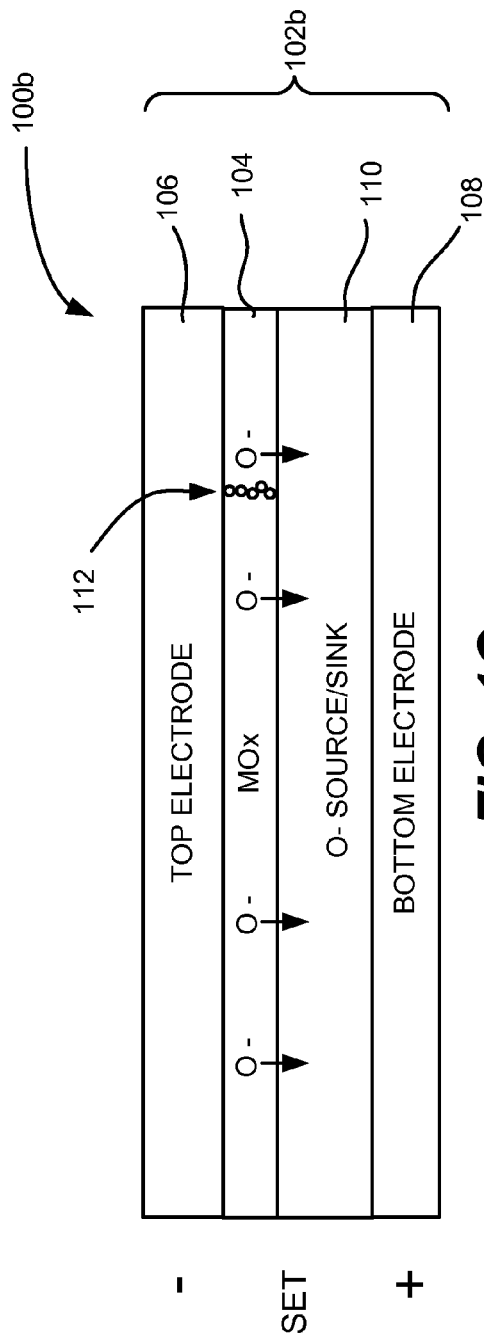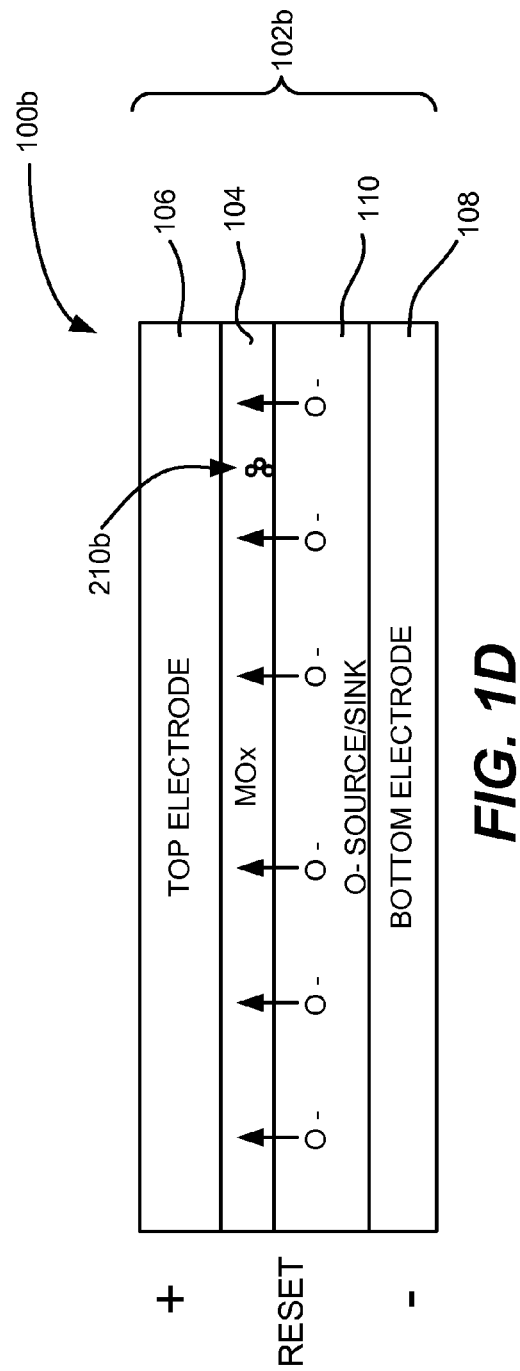

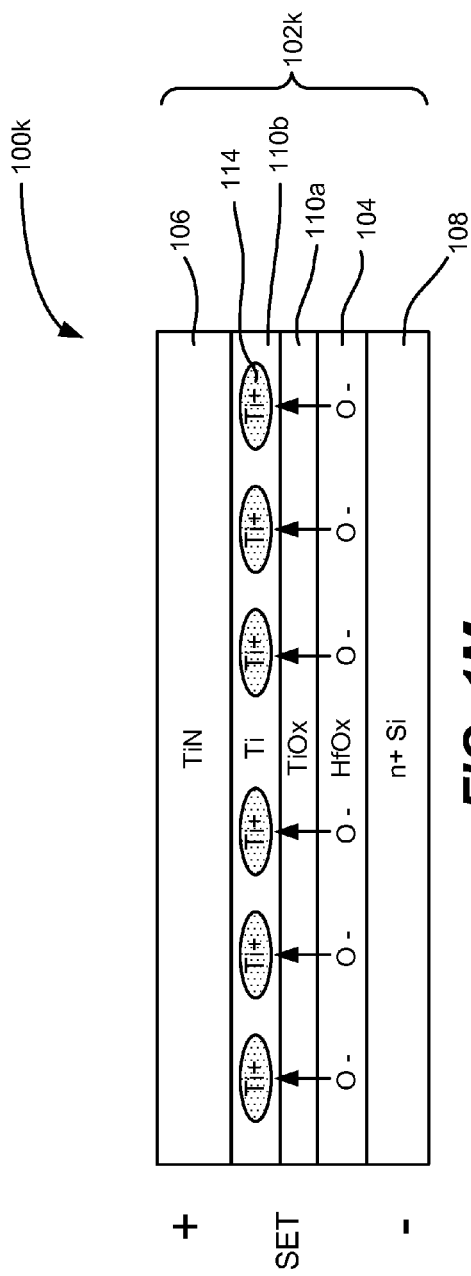
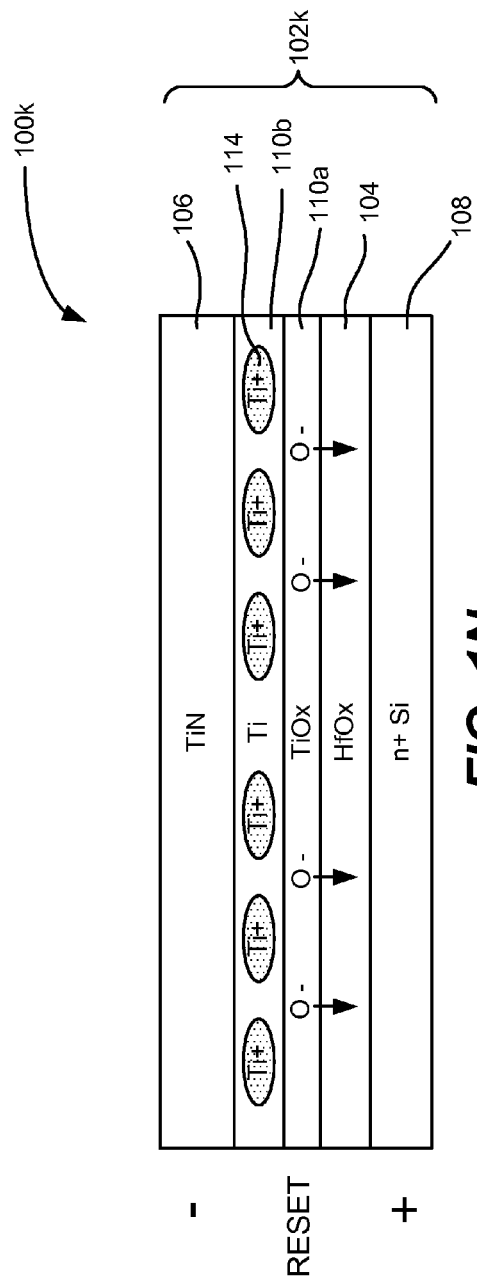

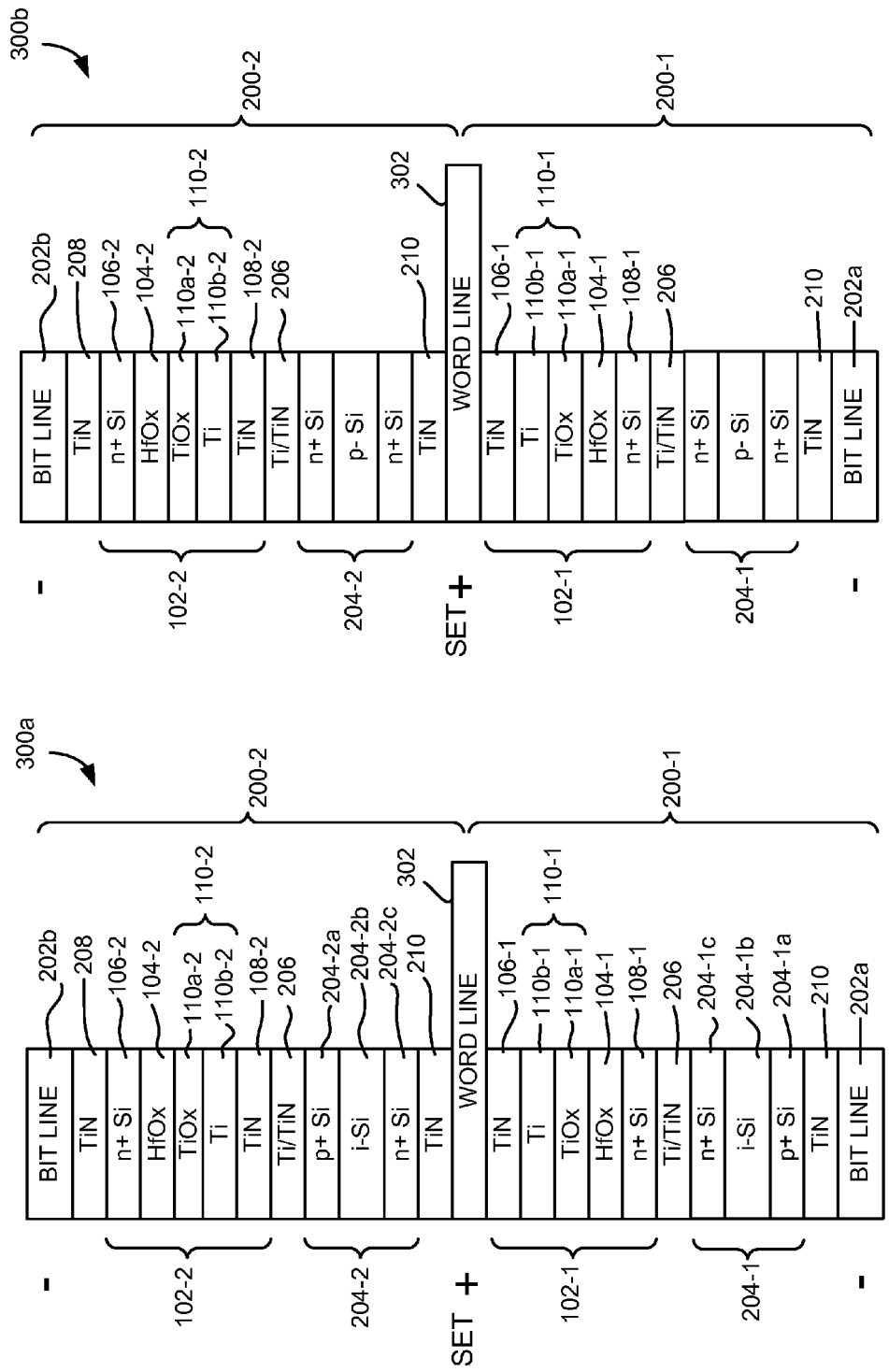

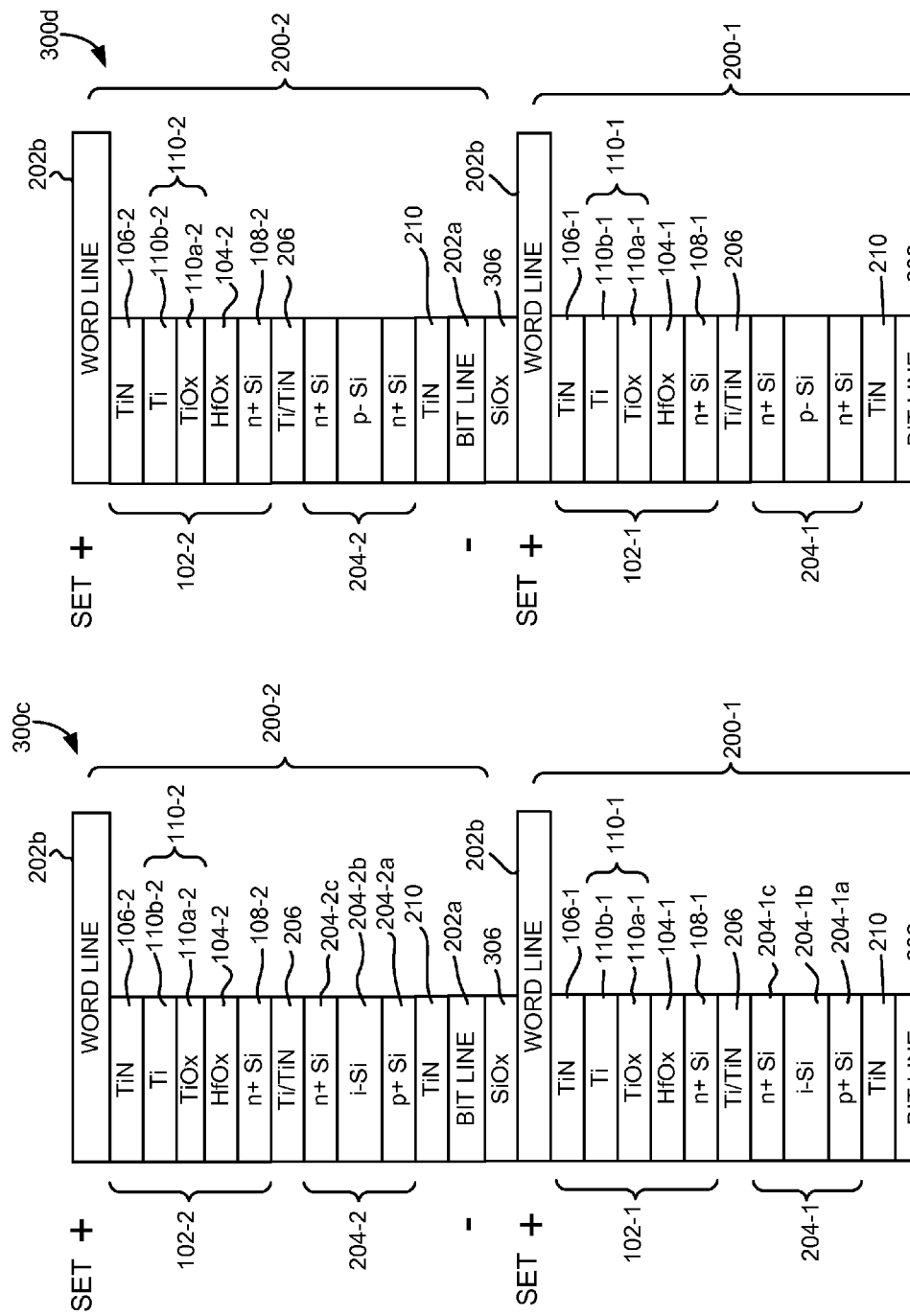

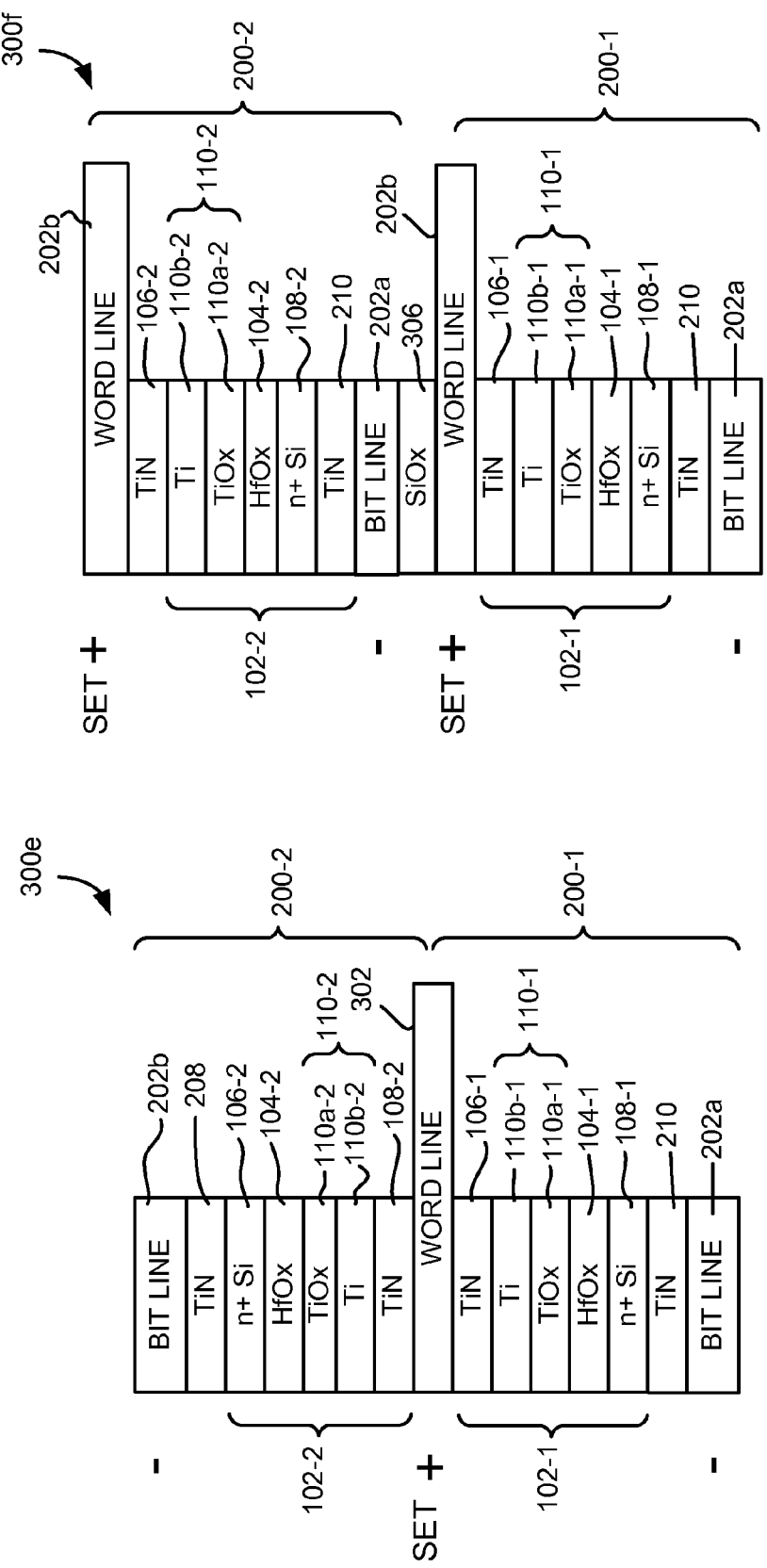

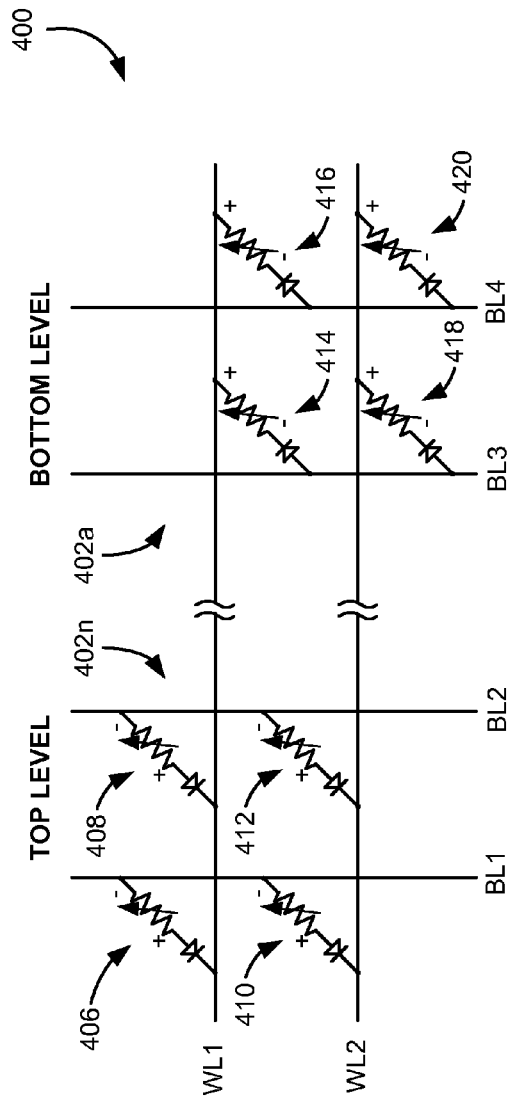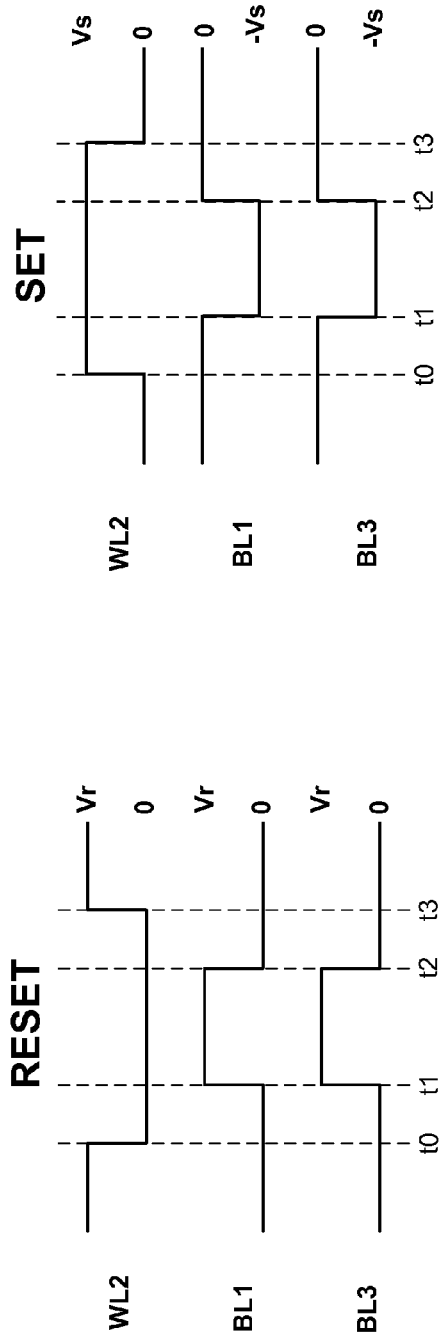
FIG. 4A
FIG. 4B
FIG. 4C

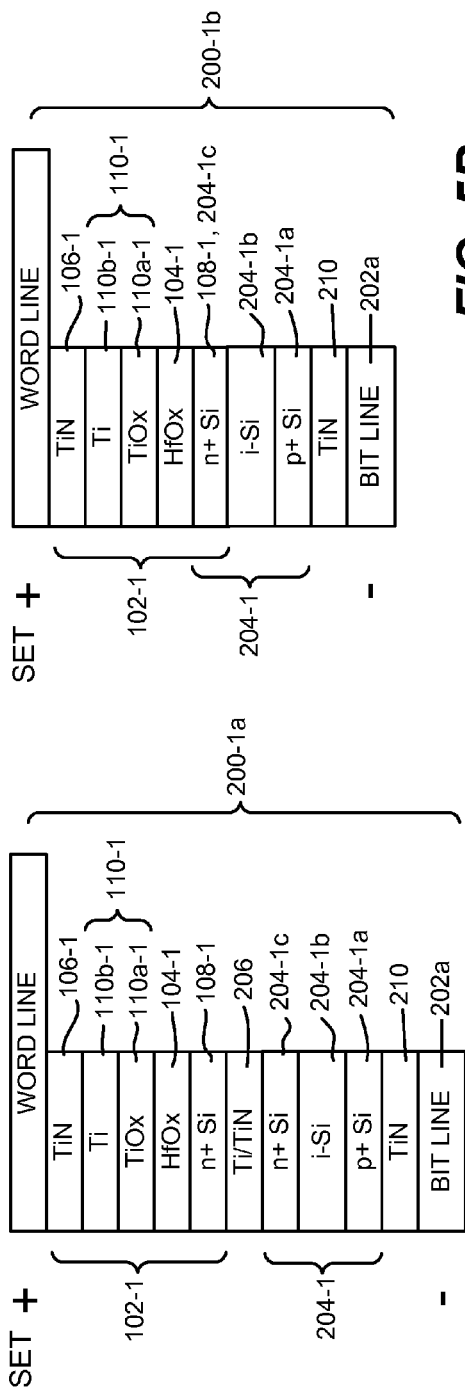
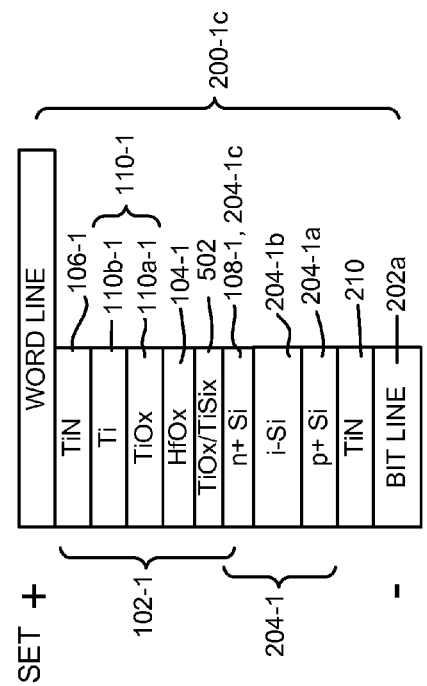
FIG. 5A
FIG. 5B
FIG. 5C

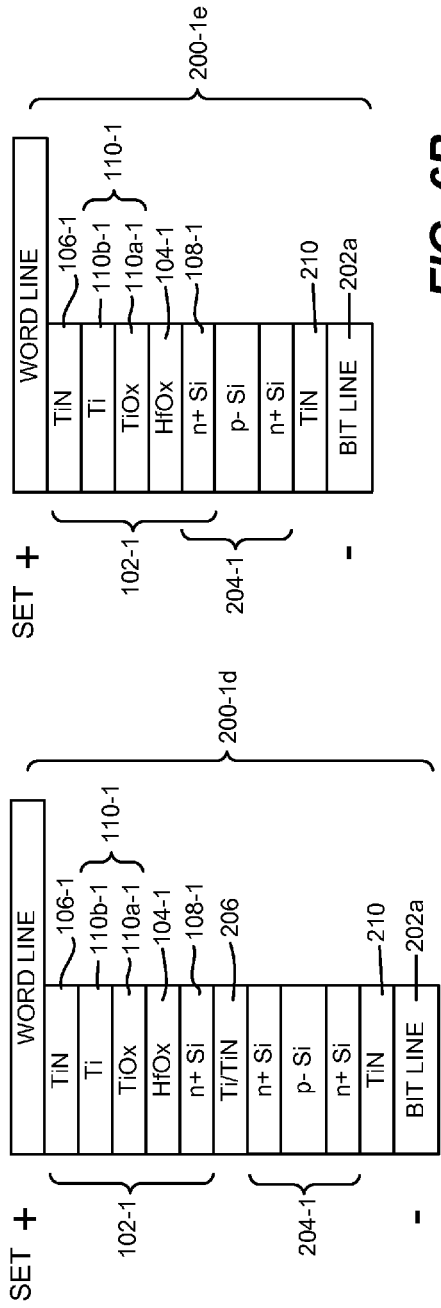
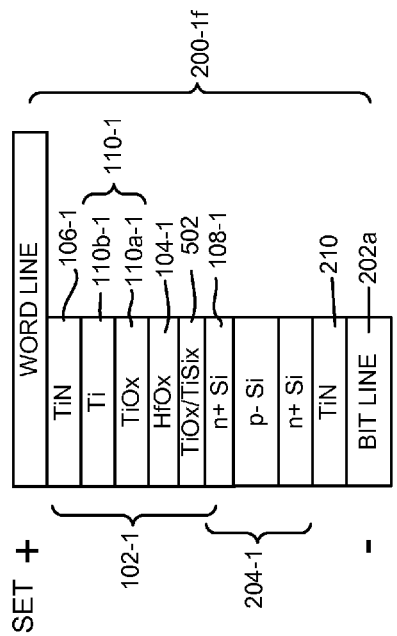
FIG. 6A
FIG. 6B
FIG. 6C

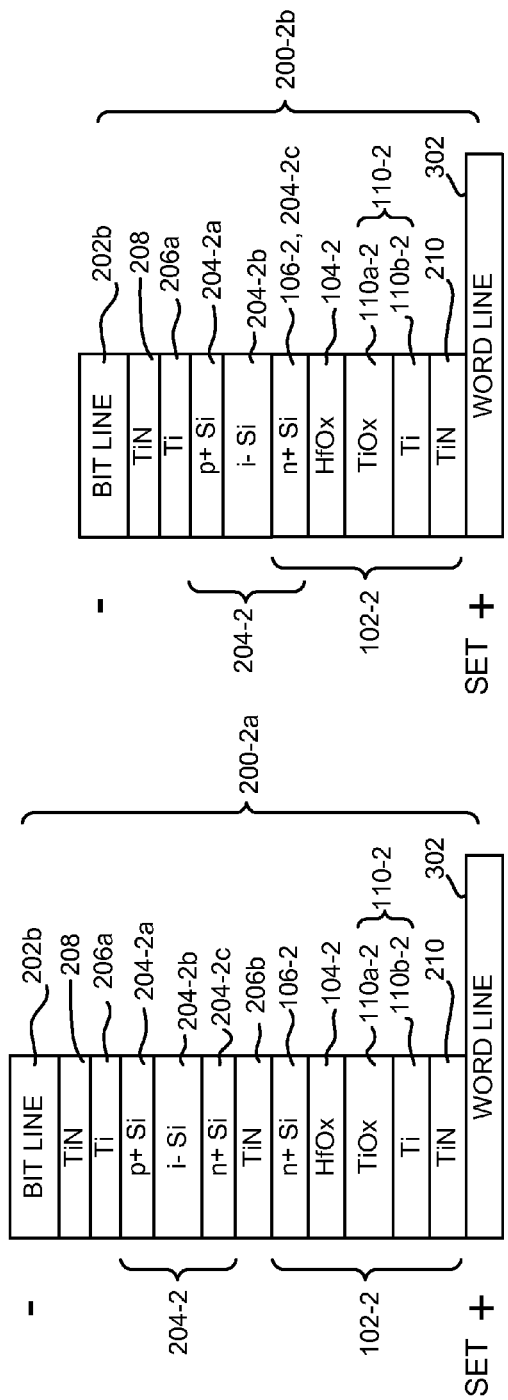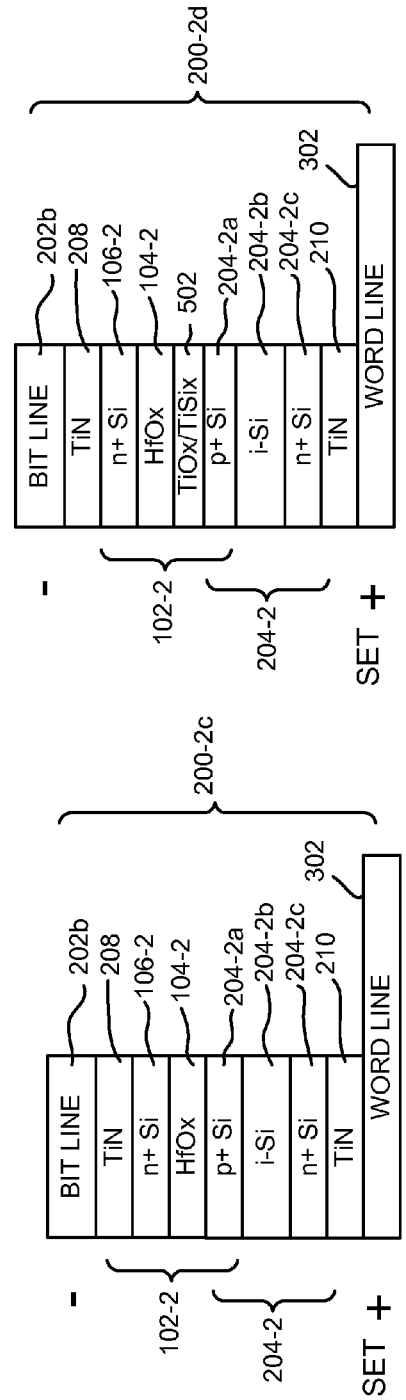

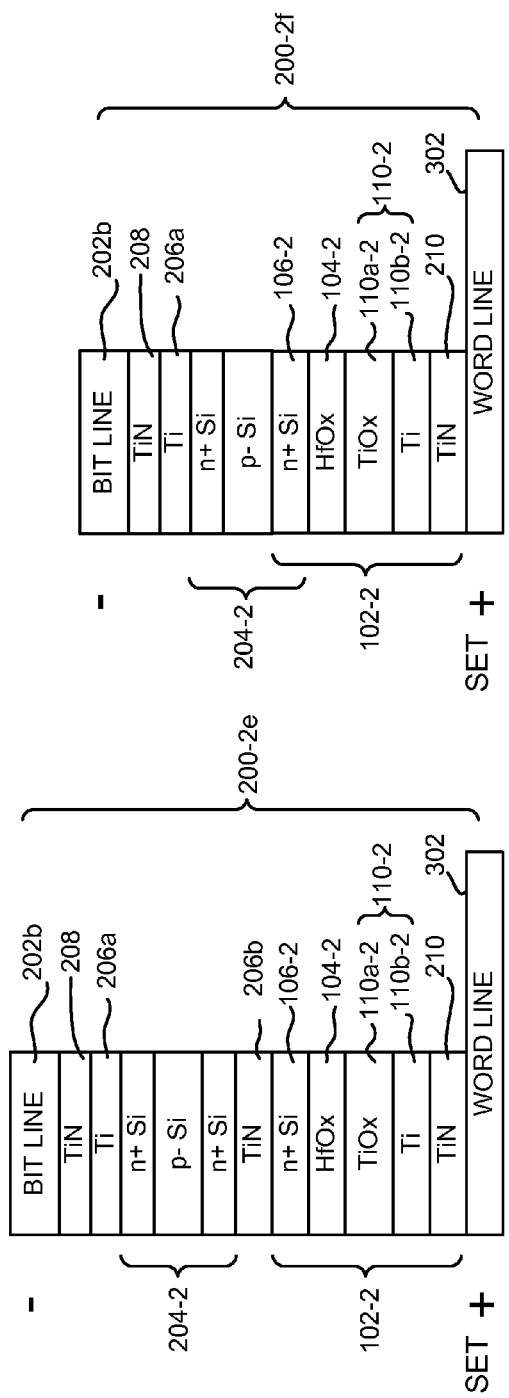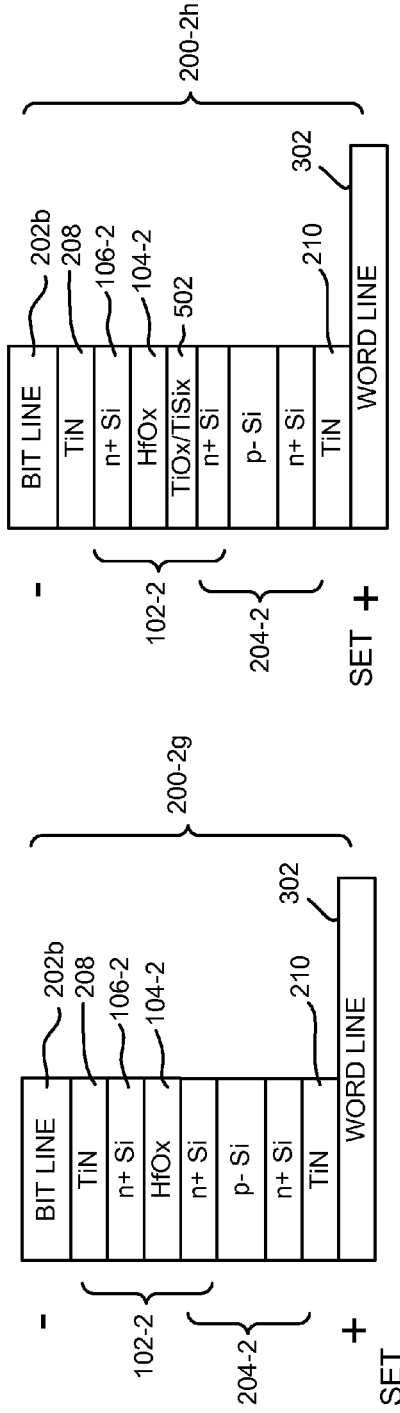

US 8,389,971 B2

MEMORY CELLS HAVING STORAGE ELEMENTS THAT SHARE MATERIAL LAYERS WITH STEERING ELEMENTS AND METHODS OF FORMING THE SAME

RELATED APPLICATIONS

The present application is related to the following U.S. Patent Applications, each of which is hereby incorporated by reference herein in its entirety:

U.S. patent application Ser. No. 12/904,770, filed Oct. 14, 2010, and titled "BIPOLAR STORAGE ELEMENTS FOR USE IN MEMORY CELLS AND METHODS OF FORMING THE SAME"; and U.S. patent application Ser. No. 12/904,802, filed Oct. 14, 2010, and titled "MULTI-LEVEL MEMORY ARRAYS WITH MEMORY CELLS THAT EMPLOY BIPOLAR STORAGE ELEMENTS AND METHODS OF FORMING THE SAME".

FIELD OF THE INVENTION

The present invention relates to memory arrays, and more particularly to memory cells having storage elements that share material layers with steering elements and methods of forming the same.

BACKGROUND OF THE INVENTION

Non-volatile memories formed from reversible resistivity-switching materials are known. For example, U.S. patent application Ser. No. 11/125,939, filed May 9, 2005 and titled "REWRITEABLE MEMORY CELL COMPRISING A DIODE AND A RESISTANCE-SWITCHING MATERIAL" (hereinafter "the '939 Application"), which is hereby incorporated by reference herein in its entirety, describes a rewriteable non-volatile memory cell that includes a diode coupled in series with a reversible resistivity-switching material such as a metal oxide or metal nitride.

However, fabricating memory devices from rewriteable resistivity-switching materials is difficult; and improved methods of forming memory devices that employ resistivity-switching materials are desirable.

SUMMARY

In a first aspect of the invention, a memory cell is provided that includes (1) a bipolar storage element formed from a metal-insulator-metal (MIM) stack including (a) a first conductive layer; (b) a reversible resistivity switching (RRS) layer formed above the first conductive layer; (c) a metal/metal oxide layer stack formed above the first conductive layer; and (d) a second conductive layer formed above the RRS layer and the metal/metal oxide layer stack; and (2) a steering element coupled to the bipolar storage element.

In a second aspect of the invention, a bipolar storage element for use in a memory cell is provided that includes an MIM stack including (1) a first conductive layer; (2) an RRS layer formed above the first conductive layer; (3) a metal/metal-oxide layer stack formed above the first conductive layer and including a metal-oxide layer and a metal layer, the metal-oxide layer formed adjacent and between the RRS layer and the metal layer; and (4) a second conductive layer formed above the RRS layer and the metal/metal oxide layer stack.

In a third aspect of the invention, a method of forming a memory cell is provided that includes (1) forming a bipolar storage element by (a) forming a first conductive layer above a substrate; (b) forming an RRS layer above the first conductive layer; (c) forming a metal/metal oxide layer stack above the first conductive layer; and (d) forming a second conductive layer above the RRS layer and the metal/metal oxide layer stack; and (2) forming a steering element coupled to the bipolar storage element.

In a fourth aspect of the invention, a method of forming a bipolar storage element for use in a memory cell is provided that includes forming an MIM stack by (1) forming a first conductive layer above a substrate; (2) forming an RRS layer above the first conductive layer; (3) forming a metal/metal-oxide layer stack above the first conductive layer, the metal/metal-oxide layer stack including a metal-oxide layer and a metal layer, the metal-oxide layer formed adjacent and between the RRS layer and the metal layer; and (4) forming a second conductive layer above the RRS layer and the metal/metal oxide layer stack.

In a fifth aspect of the invention, a memory array is provided that includes (1) a first memory cell having (a) a first conductive line; (b) a first bipolar storage element formed above the first conductive line; and (c) a second conductive line formed above the first bipolar storage element; and (2) a second memory cell formed above the first memory cell and having (a) a second bipolar storage element formed above the second conductive line; and (b) a third conductive line formed above the second bipolar storage element. The first and second memory cells share the second conductive line; the first bipolar storage element has a first storage element polarity orientation within the first memory cell; the second bipolar storage element has a second storage element polarity orientation within the second memory cell; and the second storage element polarity orientation is opposite the first storage element polarity orientation.

In sixth aspect of the invention, a memory array is provided that includes (1) a first memory cell having (a) a first conductive line; (b) a first bipolar storage element formed above the first conductive line; and (c) a second conductive line formed above the first bipolar storage element; and (2) a second memory cell formed above the first memory cell, the second memory cell having (a) a third conductive line; (b) a second bipolar storage element formed above the third conductive line; and (c) a fourth conductive line formed above the second bipolar storage element. The first bipolar storage element has a first storage element polarity orientation within the first memory cell; and the second bipolar storage element has the first storage element polarity orientation within the second memory cell.

In a seventh aspect of the invention, a method of forming a memory array is provided that includes (1) forming a first memory cell having (a) a first conductive line; (b) a first bipolar storage element formed above the first conductive line; and (c) a second conductive line formed above the first bipolar storage element; and (2) forming a second memory cell above the first memory cell and having (a) a second bipolar storage element formed above the second conductive line; and (b) a third conductive line formed above the second bipolar storage element. The first and second memory cells share the second conductive line; the first bipolar storage element has a first storage element polarity orientation within the first memory cell; the second bipolar storage element has a second storage element polarity orientation within the second memory cell; and the second storage element polarity orientation is opposite the first storage element polarity orientation.

In an eighth aspect of the invention, a method of forming a memory array is provided that includes (1) forming a first memory cell having (a) a first conductive line; (b) a first bipolar storage element formed above the first conductive line; and (c) a second conductive line formed above the first bipolar storage element; and (2) forming a second memory cell above the first memory cell, the second memory cell having (a) a third conductive line; (b) a second bipolar storage element formed above the third conductive line; and (c) a fourth conductive line formed above the second bipolar storage element. The first bipolar storage element has a first storage element polarity orientation within the first memory cell; and the second bipolar storage element has the first storage element polarity orientation within the second memory cell.

In a ninth aspect of the invention, a memory cell is provided that includes a storage element formed from an MIM stack including (1) a first conductive layer; (2) an RRS layer formed above the first conductive layer; and (3) a second conductive layer formed above the RRS layer, at least one of the first and second conductive layers comprising a first semiconductor material layer. The memory cell includes a steering element coupled to the storage element, the steering element formed from the first semiconductor material layer of the MIM stack and one or more additional material layers.

In a tenth aspect of the invention, a memory cell is provided that includes (1) a storage element formed from an MIM stack; and (2) a steering element coupled to the storage element. The storage element and steering element share at least one layer.

In an eleventh aspect of the invention, a method of forming a memory cell is provided that includes (1) forming a storage element by (a) forming a first conductive layer above a substrate; (b) forming an RRS layer above the first conductive layer; and (c) forming a second conductive layer above the RRS layer, at least one of the first and second conductive layers comprising a first semiconductor material layer; and (2) forming a steering element coupled to the storage element, the steering element formed from the first semiconductor material layer of the storage element and one or more additional material layers. Numerous other aspects are provided.

Other features and aspects of this invention will become more fully apparent from the following detailed description, the appended claims and the accompanying drawings.

BRIEF DESCRIPTION OF THE FIGURES

FIGS. 3A-3F are cross sectional views of exemplary memory cell stacks provided in accordance with the present invention.

FIG. 4A is a schematic diagram of another exemplary three dimensional memory array provided in accordance with the present invention.

FIG. 4B illustrates exemplary timing diagrams for resetting memory cells simultaneously in accordance with the present invention.

FIG. 4C illustrates exemplary timing diagrams for setting memory cells simultaneously in accordance with the present invention.

FIGS. 5A-5C are cross sectional views of first exemplary memory cell stacks in which storage elements and steering elements may share a material layer in accordance with the present invention.

FIGS. 6A-6C are cross sectional views of second exemplary memory cell stacks in which storage elements and steering elements may share a material layer in accordance with the present invention.

FIGS. 7A-7D are cross sectional views of third exemplary memory cell stacks in which storage elements and steering elements may share a material layer in accordance with the present invention.

FIGS. 8A-8D are cross sectional views of fourth exemplary memory cell stacks in which storage elements and steering elements may share a material layer in accordance with the present invention.

DETAILED DESCRIPTION

Figure 1F:
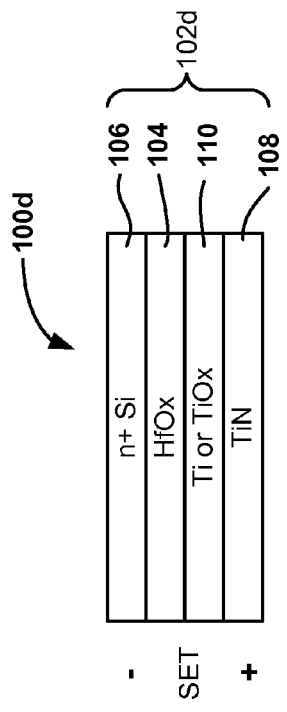
FIGS. 1A-1N are cross-sectional views of exemplary bipolar storage elements provided in accordance with the present invention.

A metal-insulator-metal (MIM) stack formed from a reversible resistivity switching (RRS) material sandwiched between two metal or otherwise conducting layers may serve as a resistance-switching element for a memory cell. The two conducting layers may serve as the top and bottom electrodes of the resistance-switching element, and may be used to apply an electric field across the RRS material that changes the resistivity of the RRS material from a high value to a low value and vice versa.

Unipolar MIM stacks employ similar materials on each side of the RRS material, such as the same or similar electrode materials, and generally operate the same independent of which electrode is biased positively or negatively. For some RRS materials, such as metal oxides, unipolar MIM stacks may not switch reliably and may suffer from low yield (e.g., due to set and reset operations being performed using the same voltage polarity with little separation between the set and reset voltages). As such, some unipolar MIM stacks may be unsuitable for use in memory cells and memory arrays.

Bipolar MIM stacks may be more reliable than unipolar MIM stacks because bipolar MIM stacks employ set and reset voltages that have opposite polarities. However, bipolar MIM stacks may require large forming voltages to initiate reliable switching.

In accordance with embodiments of the present invention, bipolar MIM stacks are provided that exhibit improved switching properties and that may be fabricated using conventional fabrication techniques. Methods of forming such bipolar MIM stacks, as well as methods of employing such bipolar MIM stacks in three-dimensional (3D) memory arrays, are also provided.

These and other embodiments of the invention are described below with reference to FIGS. 1A-4C.

Exemplary MIM Stacks

FIGS. 1A-1N are cross-sectional views of exemplary bipolar storage elements 100a-k provided in accordance with the present invention. Exemplary process details for forming such bipolar storage elements are described below with reference to FIGS. 3A-3F.

Each bipolar storage element 100a-k takes the form of an MIM stack 102a-k that includes a reversible resistivity switching (RRS) material 104 sandwiched between a top electrode 106 and a bottom electrode 108. One or more additional layers 110 such as a metal layer, a metal oxide layer, a metal/metal oxide layer stack, or the like, may be employed within the MIM stack 102a-k as described further below.

Each MIM stack 102a-k exhibits bipolar switching due to differences between the top electrode 106/RRS material 104 interface and the bottom electrode 108/RRS material 104 interface (e.g., differences in work function, electron affinity, oxygen affinity, interfacial layers, etc.). Such bipolar MIM stacks preferentially set with one voltage polarity applied between the top and bottom electrodes 106 and 108, and preferentially reset with the opposite voltage polarity applied between the top and bottom electrodes 106 and 108.

In some embodiments, the MIM stacks 102a-k also may be asymmetrical, with different numbers, types and/or thicknesses of materials on either side of the RRS material 104.

The RRS material 104 may include, for example, $HfO_X$, $ZrO_X$, $NiO_X$, $TiO_X$, $TaO_X$, $NbO_X$, $Al_XO_Y$, another metal oxide ($MO_X$) layer, or another suitable switching material. In some embodiments, the top electrode 106 may include titanium nitride, tantalum nitride, tungsten nitride, combinations of the same, a metal/metal nitride stack such as Ti/TiN, Ta/TaN, W/WN or another similar layer; and the bottom electrode 108 may include heavily doped semiconductor such as n+ silicon or p+ silicon, heavily doped germanium, heavily doped silicon-germanium, etc. In other embodiments, the top electrode 106 may include heavily doped semiconductor such as n+ silicon or p+ silicon, heavily doped germanium, heavily doped silicon-germanium, etc.; and the bottom electrode 108 may include titanium nitride, tantalum nitride, tungsten nitride, combinations of the same, a metal/metal nitride stack such as Ti/TiN, Ta/TaN, W/WN or another similar layer. Other materials and/or configurations may be used for the top and/or bottom electrodes 106 and 108.

In some embodiments, the additional layer(s) 110 may include, for example, titanium, titanium oxide, tantalum, tantalum oxide, tungsten, tungsten oxide, etc. In yet other embodiments, the additional layer(s) 110 may include a metal/metal oxide layer stack such as Ti/$TiO_X$, Zr/$ZrO_X$, Ni/$NiO_X$, Al/$Al_XO_Y$, Ta/$TaO_X$, Nb/$NbO_X$, Hf/$HfO_X$, or any suitable layer stack.

Operation of the bipolar MIM stacks of the present invention is now described. Referring to FIGS. 1A-1B, the bipolar MIM stack 100a may reside in either a low resistance or "set" state (FIG. 1A) or a high resistance or "reset" state (FIG. 1B). While not wishing to be bound by any particular theory, it is believed that the RRS material 104 may have its resistivity modulated by the creation and/or elimination of oxygen vacancies 112 within the RRS material 104. In some embodiments, when a sufficient number of oxygen vacancies 112 are present within the RRS material 104, conductive paths or filaments may extend across the entire width of the RRS material 104 (as shown in FIG. 1A) and may create a low resistance path through the RRS material 104. Likewise, oxygen vacancies may be eliminated from the RRS material 104 so as to eliminate conductive paths or filaments that extend across the RRS material 104 (as shown in FIG. 1B) and increase the resistance of any path through the RRS material 104. In other embodiments, conductive paths or filaments may not actually be formed, and merely an increase in oxygen vacancy density may decrease RRS material resistivity while a decrease in oxygen vacancy density may increase RRS material resistivity.

When first formed, the RRS material 104 is typically in a high resistivity state and a forming voltage is applied to place the RRS material 104 in a condition that can be modulated by application of set and reset voltages of the appropriate polarity (as described further below). The forming voltage is typically significantly larger than the set or reset voltages (e.g., about 14-16 volts versus about 7-10 volts). While not wishing to be bound by any particular theory, application of the forming voltage may create a baseline number of oxygen vacancies within the RRS material 104, and the number of oxygen vacancies within the RRS material 104 may be modulated about this baseline number via application of set and reset voltages so as to modulate the resistivity of the RRS material 104.

In embodiments of the present invention, the additional layer(s) 110 is believed to "getter" oxygen ions from the RRS material 104 during a set operation (FIG. 1A), creating oxygen vacancies 112 within the RRS material 104 as the oxygen ions leave the RRS material 104 and travel to the additional layer(s) 110. This causes the RRS material 104 to switch to a low resistivity state. Likewise, the additional layer(s) 110 is believed to seed oxygen ions to the RRS material 104 during a reset operation (FIG. 1B), passivating oxygen vacancies within the RRS material 104 as oxygen ions travel from the additional layer(s) 110 to the RRS material 104. This causes the RRS material 104 to switch to a high resistivity state.

As used herein, a bipolar MIM stack that employs a positive voltage applied to its top electrode relative to its bottom electrode during a set operation is referred to as having a "positive polarity" or a "positive polarity orientation". Likewise, a bipolar MIM stack that employs a negative voltage applied to its top electrode relative to its bottom electrode during a set operation is referred to as having a "negative polarity" or a "negative polarity orientation".

The MIM stack 102a is an example of a "positive polarity" MIM stack. For example, to set the MIM stack 102a to a low resistance state, a positive voltage is applied to the top electrode 106 relative to the bottom electrode 108. This may cause negative oxygen ions (O—) within the RRS material 104 to travel toward the additional layer(s) 110. As the oxygen ions leave the RRS material 104, oxygen vacancies 112 are formed within the RRS material 104, lowering the resistivity of the RRS material 104 and in some cases creating one or more conductive paths or filaments within the RRS material 104 as shown in FIG. 1A. To reset the MIM stack 102a to a high resistance state, the opposite voltage polarity is applied to the top electrode 106 relative to the bottom electrode 108, which may cause oxygen ions to travel from the additional layer(s) 110 to the RRS material 104. This may passivate oxygen vacancies in the RRS material 104, in some cases break conduction paths or filaments that extend across the RRS material 104, and increase the resistivity of the RRS material 104.

FIGS. 1C-1D illustrate a "negative polarity" MIM stack 102b in which the positions of the RRS material 104 and additional layer(s) 110 are reversed. As will be described below, the top and bottom electrode materials also may be reversed. The MIM stack 102b is set by applying a negative voltage polarity to the top electrode 106 relative to the bottom electrode 108 (FIG. 1C); and reset by applying a positive voltage polarity to the top electrode 106 relative to the bottom electrode 108 (FIG. 1D). Additional MIM stacks provided in accordance with the present invention are now described with reference to FIGS. 1E-1N.

Figure 1H:
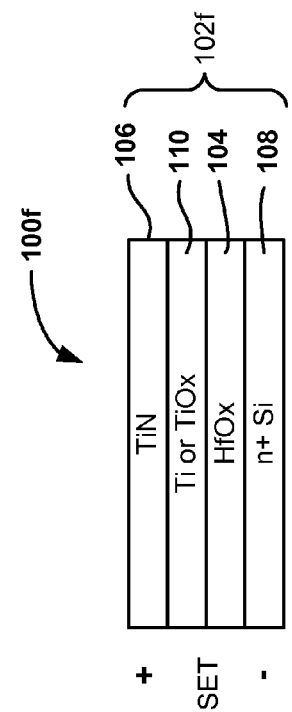
Figure 1E:
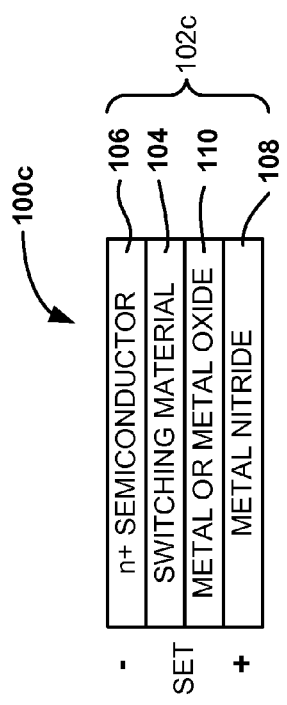

FIG. 1E illustrates a cross-sectional view of a third exemplary bipolar storage element 100c (MIM stack 102c) having a bottom metal nitride electrode 108, a metal or metal oxide layer 110 formed above the bottom electrode 108, RRS material 104 formed above the metal or metal oxide layer 110, and a top heavily doped semiconductor electrode 106 formed above the RRS material 104. To "set" the MIM stack 102c to a low resistance state, a negative voltage is applied to the top electrode 106 relative to the bottom electrode 108. Likewise, to "reset" the MIM stack 102c to a high resistance state, a positive voltage is applied to the top electrode 106 relative to the bottom electrode 108.

In general, the bottom electrode 108 may include, for example, titanium nitride, tantalum nitride, tungsten nitride, combinations of the same, a metal/metal nitride stack such as Ti/TiN, Ta/TaN, W/WN or another similar barrier layer. The metal or metal oxide layer 110 may include, for example, titanium, titanium oxide, tantalum, tantalum oxide, tungsten, tungsten oxide, or another similar layer. The RRS material 104 may include, for example, $HfO_X$, $ZrO_X$, $NiO_X$, $TiO_X$, $TaO_X$, $NbO_X$ or $Al_XO_Y$ or another suitable switching material. The top electrode 106 may include heavily doped silicon such as n+ silicon or p+ silicon, heavily doped germanium, heavily doped silicon-germanium, etc.

FIG. 1F illustrates a particular exemplary embodiment of the MIM stack 102c, referred to as MIM stack 102d in FIG. 1F, in which the bottom electrode 108 is titanium nitride, the metal or metal oxide layer 110 is titanium or titanium oxide, the RRS material 104 is hafnium oxide and the top electrode 106 is n+ silicon. For example, the bottom electrode 108 (TiN) may have a thickness of about 10-60 nanometers, and in some embodiments about 20 nanometers. The Ti or $TiO_X$ layer 110 may have a thickness of about 0.5-10 nanometers, and in some embodiments about 4 nanometers. When $TiO_X$ is employed, x may be about 1.2-2, and in some embodiments about 1.5. The hafnium oxide layer 104 may have a thickness of about 3-12 nanometers, and in some embodiments about 5 nanometers, with x being about 1.2-2.0 and in some embodiments about 1.7. The n+ silicon layer 106 may have a thickness of about 10-100 nanometers, and in some embodiments about 20 nanometers. The doping concentration of the n+ silicon layer 106 may be about $5\times10^{19}$-$5\times10^{21}$ atoms/cm$^3$ and in some embodiments about $2\times10^{20}$ atoms/cm$^3$. Other film thicknesses, x values and/or doping concentrations may be used. The MIM stack 102d is set and reset using the same voltage polarities described above for MIM stack 102c.

Figure 1G:
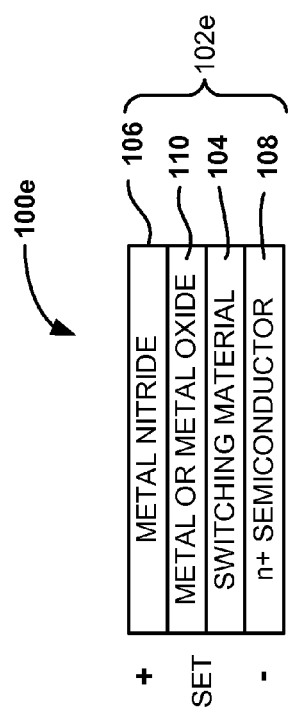

FIGS. 1G-1H illustrate additional MIM stacks 102e and 102f which represent "inverted" versions of MIM stacks 102c and 102d, respectively. Specifically, the order of the material layers is MIM stack 102e is reversed relative to MIM stack 102c, and the order of the material layers in MIM stack 102f is reversed relative to MIM stack 102d. MIM stacks 102e and 102f are "set" to a low resistance state by applying a positive voltage to the top electrode 106 relative to the bottom electrode 108. Likewise, to "reset" the MIM stack 102e or 102f to a high resistance state, a negative voltage is applied to the top electrode 106 relative to the bottom electrode 108.

Figure 1J:
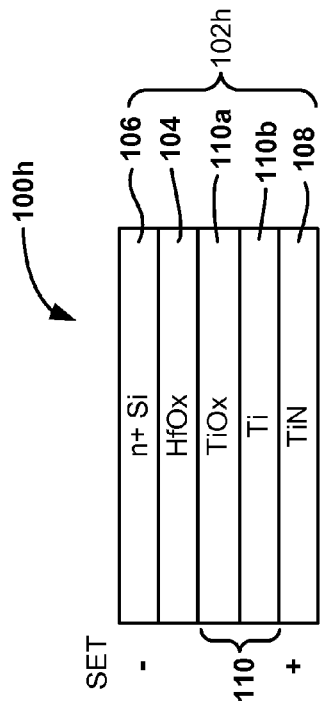
Figure 1I:
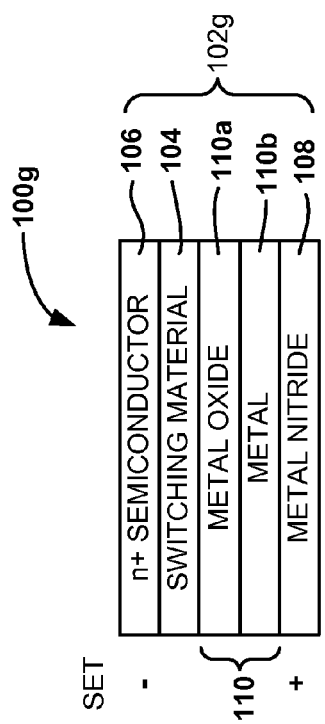

FIG. 1I illustrates a cross-sectional view of another exemplary bipolar storage element 100g (MIM stack 102g) having a bottom metal nitride electrode 108, a metal/metal oxide layer stack 110 including metal oxide layer 110a and metal layer 110b formed above the bottom electrode 108, RRS material 104 formed above the metal/metal oxide layer stack 110, and a top heavily doped semiconductor electrode 106 formed above the RRS material 104.

While not wishing to be bound by any particular theory, in such an arrangement, the metal layer 110b is believed to "getter" oxygen ions from the RRS material 104 during a set operation, creating oxygen vacancies within the RRS material 104 as the oxygen ions leave the RRS material 104 and travel to the metal layer 110b and allowing the RRS material 104 to switch to a low resistivity state. Likewise, the metal oxide layer 110a is believed to seed oxygen ions to the RRS material 104 during a reset operation, passivating oxygen vacancies within the RRS material 104 as oxygen ions travel from the metal oxide layer 110a to the RRS material 104 and allowing the RRS material 104 to switch to a high resistivity state. In some embodiments, the metal oxide layer 110a may serve as a buffer layer and reduce damage to interface(s) of the RRS material 104 due to the strong gettering properties of the metal layer 110b during multiple switching operations.

To "set" the MIM stack 100g to a low resistance state, a negative voltage is applied to the top electrode 106 relative to the bottom electrode 108. Likewise, to "reset" the MIM stack 100g to a high resistance state, a positive voltage is applied to the top electrode 106 relative to the bottom electrode 108.

In general, the bottom electrode 108 may include, for example, titanium nitride, tantalum nitride, tungsten nitride, combinations of the same, a metal/metal nitride stack such as Ti/TiN, Ta/TaN, W/WN or another similar barrier layer. The metal/metal oxide layer stack 110 may include, for example, $Ti/TiO_X$, $Zr/ZrO_X$, $Ni/NiO_X$, $Al/Al_XO_Y$, $Ta/TaO_X$, $Nb/NbO_X$, $Hf/HfO_X$ or another similar layer stack. The RRS material 104 may include, for example, $HfO_X$, $ZrO_X$, $NiO_X$, $TiO_X$, $TaO_X$, $NbO_X$ or $Al_XO_Y$ or another suitable switching material. The top electrode 106 may include n+ silicon, p+ silicon, heavily doped germanium, heavily doped silicon-germanium, etc.

In some embodiments, the metal/metal-oxide layer stack 110 may be formed from a different material than is employed for the RRS material 104. For example, a $Ti/TiO_X$ layer stack may be employed with a $HfO_X$, $ZrO_X$, $NiO_X$, $TaO_X$, $NbO_X$ or $Al_XO_Y$ switching material. A $Zr/ZrO_X$ layer stack may be used with a $HfO_X$, $NiO_X$, $TiO_X$, $TaO_X$, $NbO_X$ or $Al_XO_Y$ switching material. A $Ni/NiO_X$ layer stack may be used with a $HfO_X$, $ZrO_X$, $TiO_X$, $TaO_X$, $NbO_X$ or $Al_XO_Y$ switching material. An $Al/Al_XO_Y$ layer stack may be employed with a $HfO_X$, $ZrO_X$, $NiO_X$, $TiO_X$, $TaO_X$, or $NbO_X$ switching material. A $Ta/TaO_X$ layer stack may be employed with a $HfO_X$, $TiO_X$, $ZrO_X$, $NiO_X$, $NbO_X$ or $Al_XO_Y$ switching material. A $Nb/NbO_X$ layer stack may be employed with a $HfO_X$, $TiO_X$, $ZrO_X$, $NiO_X$, $TaO_X$ or $Al_XO_Y$ switching material. A $Hf/HfO_X$ layer stack may be employed with a $NbO_X$, $TiO_X$, $ZrO_X$, $NiO_X$, $TaO_X$ or $Al_XO_Y$ switching material.

In other embodiments, the metal/metal oxide layer stack 110 may be formed from a similar material to that employed for the RRS material 104. For example, a $Ti/TiO_X$ layer stack may be employed with a $TiO_X$ switching layer. However, in such embodiments, the metal oxide of the layer stack may have a different crystalline structure or other property compared to that of the switching material (e.g., amorphous versus crystalline structure). It is believed that the metal oxide layer of the metal/metal-oxide layer stack 110 may serve as a "buffer" layer that allows formation/elimination of oxygen vacancies within the switching material to be more controllable and/or repeatable, which may improve the endurance/longevity of the switching material.

FIG. 1J illustrates a particular exemplary embodiment of the MIM stack 102g, referred to as MIM stack 102h in FIG. 1J, in which the bottom electrode 108 is titanium nitride, the metal/metal oxide layer stack 110 is titanium oxide over titanium, the RRS material 104 is hafnium oxide and the top electrode 106 is n+ silicon. For example, the bottom electrode 108 (TiN) may have a thickness of about 10-60 nanometers, and in some embodiments about 20 nanometers. The Ti layer 110b may have a thickness of about 0.5-10 nanometers, and in some embodiments about 4 nanometers. The $TiO_x$ layer 110a may have a thickness of about 0.5-6 nanometers, and in some embodiments about 1 nanometer; and x may be about 1.2-2.0 and in some embodiments about 1.5. The hafnium oxide layer 104 may have a thickness of about 3-12 nanometers, and in some embodiments about 5 nanometers; and x may be about 1.2-2 and in some embodiments about 1.7. The n+ silicon layer 106 may have a thickness of about 10-100 nanometers, and in some embodiments about 20 nanometers. The doping concentration of the n+ silicon layer 106 may be about $5\times10^{19}$-$5\times10^{21}$ atoms/$cm^3$ and in some embodiments about $2\times10^{20}$ atoms/$cm^3$. Other film thicknesses, x values and/or doping concentrations may be used. The MIM stack 102h is set and reset using the same polarities described above for MIM stack 102g.

Figure 1L:
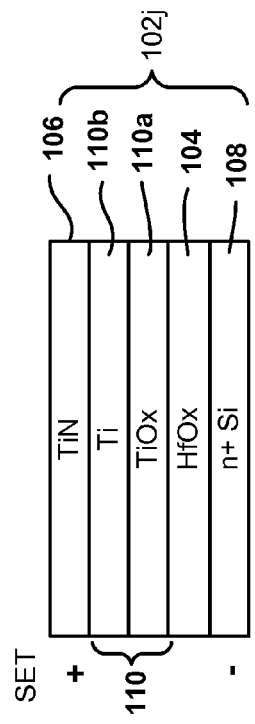
Figure 1K:
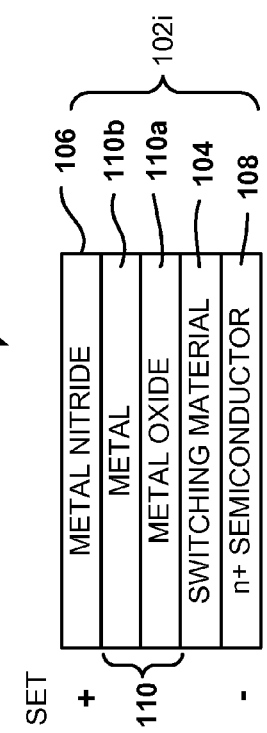

FIGS. 1K-1L illustrate additional MIM stacks 102i and 102j which represent "inverted" versions of MIM stacks 102g and 102h, respectively. Specifically, the order of the material layers in MIM stack 102i is reversed relative to MIM stack 102g, and the order of the material layers in MIM stack 102j is reversed relative to MIM stack 102h. MIM stacks 102i and 102j are "set" to a low resistance state by applying a positive voltage to the top electrode 106 relative to the bottom electrode 108. Likewise, to "reset" the MIM stack 102i or 102j to a high resistance state, a negative voltage is applied to the top electrode 106 relative to the bottom electrode 108.

FIGS. 1M-1N illustrate a particular embodiment of an MIM stack 102k similar to the MIM stack 102j of FIG. 1L. On test wafers having the MIM stack 102k, TEM images reveal a sharp interface between the $HfO_x$ and $TiO_x$ layers 104 and 110a. The interface between $TiO_x$ and Ti layers 110a and 110b appears less sharp, with a mixture of amorphous and crystalline structures being observed in the $TiO_x$/Ti layer stack 110. For example, in some test samples, no pure Ti layer 110b appears to exist as oxygen may diffuse into the Ti Layer 110b, such as from the $TiO_x$ and/or $HfO_x$ layers 110a and/or 104, forming Ti rich islands 114 (e.g., metal rich regions surrounded by metal oxide). Nitrogen may also diffuse into the $TiO_x$ layer 110a and/or the Ti layer 110b from the TiN layer 106. Indeed, in some embodiments, a structure similar to the MIM stack 102k of FIG. 1M and/or FIG. 1N has been observed when a thick (e.g., about 8 or more nanometers) Ti layer is deposited over the $HfO_x$ layer 104 without the $TiO_x$ layer, presumably due to oxygen diffusion into the Ti layer from the $HfO_x$ layer 104.

While not wishing to be bound by any particular theory, in such an arrangement, the Ti+ islands 114 of Ti layer 110b are believed to "getter" oxygen ions from the RRS material 104 during a set operation, creating oxygen vacancies within the RRS material 104 as the oxygen ions leave the RRS material 104 and travel to the Ti layer 110b and allowing the RRS material 104 to switch to a low resistivity state (FIG. 1M). Likewise, the $TiO_x$ layer 110a is believed to seed oxygen ions to the RRS material 104 during a reset operation, passivating oxygen vacancies within the RRS material 104 as oxygen ions travel from the $TiO_x$ layer 110a to the RRS material 104 and allowing the RRS material 104 to switch to a high resistivity state.

Suitable values for forming, set and reset voltages for MIM stacks 102a-k depend on a number of factors such as the types and/or thicknesses of materials used. In some embodiments, for MIM stacks that are positively oriented, a forming voltage of about +14 to +16 volts or more, a set voltage of about +9 to +11 volts, and/or a reset voltage of about −7 to −8 volts may be used. Likewise, for MIM stacks that are negatively oriented, a forming voltage of about −14 to −16 volts or more, a set voltage of about −9 to −11 volts, and/or a reset voltage of about +7 to +8 volts may be used. Any other suitable forming, set and/or reset voltages may be employed.

The above MIM stacks 102a-k were described as having low-resistance set states and high-resistance reset states. In other embodiments, MIM stacks 102a-k may have high resistance set states and low-resistance reset states.

Exemplary Inventive Memory Cell

Figure 2A:
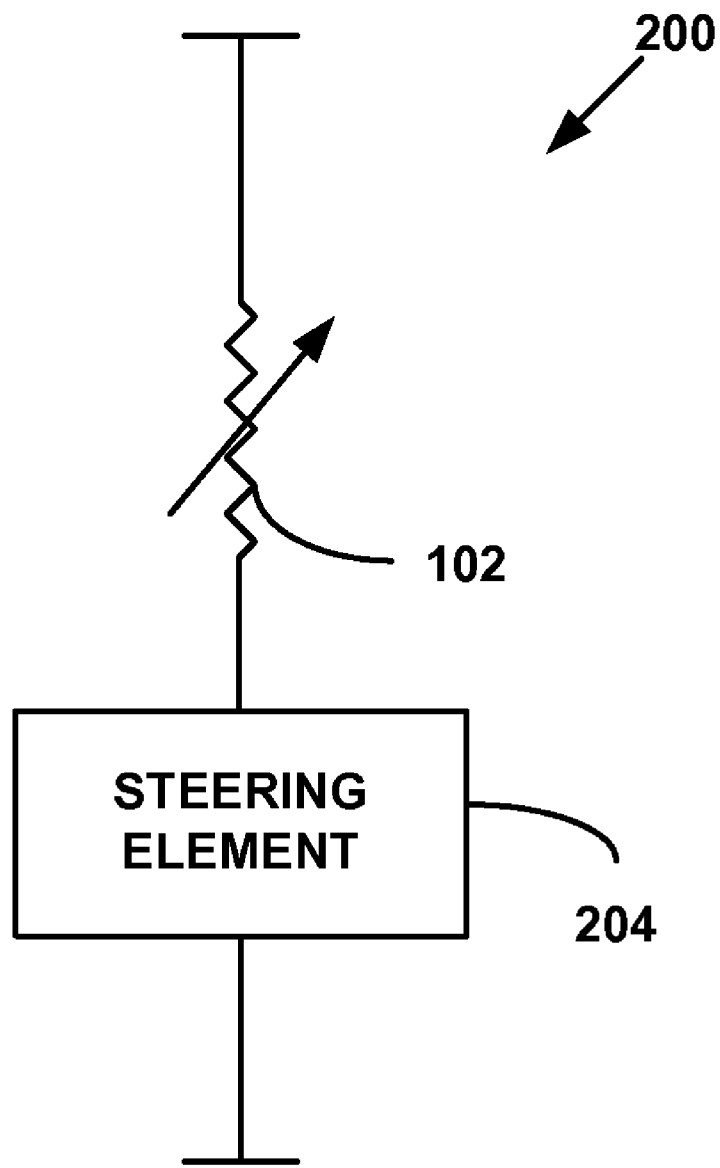
FIG. 2A is a schematic illustration of an exemplary memory cell in accordance with this invention.

FIG. 2A is a schematic illustration of an exemplary memory cell 200 in accordance with this invention. Memory cell 200 includes MIM stack 102 coupled to a steering element 204. MIM stack 102 includes RRS material 104 (not separately shown) which has a resistivity that may be reversibly switched between two or more states, as described previously with reference to FIGS. 1A-1N.

Steering element 204 may include a thin film transistor, a diode, a metal-insulator-metal tunneling current device, a punch-through diode, a Schottky-diode or another similar steering element that exhibits non-ohmic conduction by selectively limiting the voltage across and/or the current flow through MIM stack 102. In this manner, memory cell 200 may be used as part of a two or three dimensional memory array and data may be written to and/or read from memory cell 200 without affecting the state of other memory cells in the array. In some embodiments, steering element 204 may be omitted, and memory cell 200 may be used with a remotely located steering element.

Exemplary Embodiments of Memory Cells and Memory Arrays

Figure 2B:
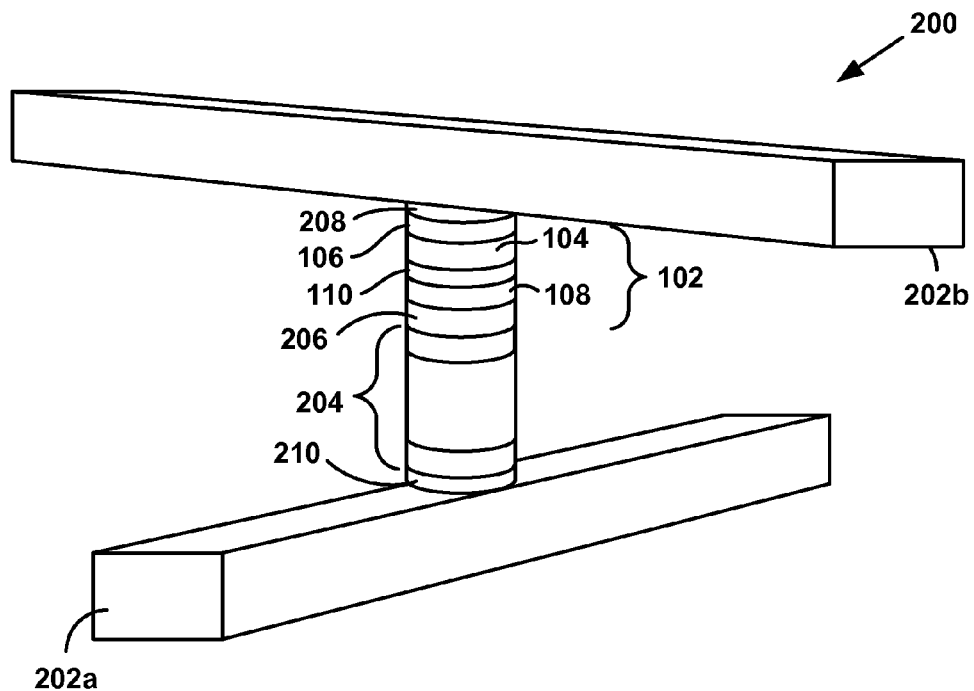
FIG. 2B is a simplified perspective view of another exemplary embodiment of a memory cell in accordance with this invention.

FIG. 2B is a simplified perspective view of an exemplary embodiment of memory cell 200 in accordance with this invention in which steering element 204 is a diode. Memory cell 200 includes MIM stack 102 (having RRS material 104) coupled in series with diode 204 between a first conductor 202a and a second conductor 202b.

As described above with reference to FIGS. 1A-1N, MIM stack 102 may serve as a reversible resistance-switching element for the memory cell 200. The MIM stack 102 may be similar to any of MIM stacks 102a-k of FIGS. 1A-1N, or any other suitable MIM stack, and may include a top conducting layer 106 and a bottom conducting layer 108 that surround RRS material 104 and serve as top and bottom electrodes for the MIM stack 102. One or more additional layers 110 such as a metal layer, a metal oxide layer, a metal/metal oxide layer stack, or the like, may be employed within the MIM stack 102 as described previously.

In some embodiments, a barrier layer 206 may be formed between MIM stack 102 and diode 204, and a barrier layer 208 may be formed between MIM stack 102 and second conductor 202b. An additional barrier layer 210 may be formed between diode 204 and first conductor 202a. Barrier layers 206, 208 and 210 may include titanium, titanium nitride, tantalum, tantalum nitride, tungsten, tungsten nitride, molybdenum, combinations of the same, or another similar barrier layer. Barrier layer 208 may be separate from or part of second conductor 202b and barrier layer 210 may be separate from or part of first conductor 202a.

Diode 204 may include any suitable diode such as a vertical polycrystalline p-n or p-i-n diode, whether upward pointing with an n-region above a p-region of the diode or downward pointing with a p-region above an n-region of the diode, a p-n-p or n-p-n punch through diode, a Schottky diode or the like. Exemplary embodiments of diode 204 are described below with reference to FIGS. 3A-3D.

Figure 2C:
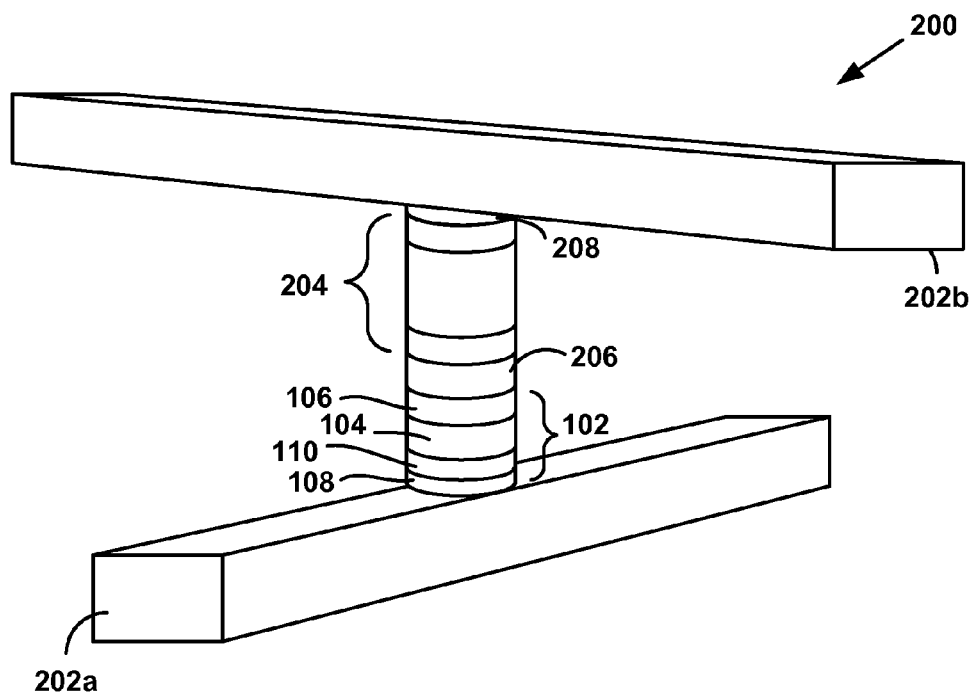
FIG. 2C is a simplified perspective view of yet another exemplary embodiment of a memory cell in accordance with this invention.

In the embodiment of FIG. 2B, the MIM stack 102 is positioned above diode 204. However, as shown in FIG. 2C, the MIM stack 102 alternatively may be positioned below the diode 204.

First conductor 202a and/or second conductor 202b may include any suitable conductive material such as tungsten, any appropriate metal, heavily doped semiconductor material, a conductive silicide, a conductive silicide-germanide, a conductive germanide, a highly conductive carbon or the like. In the embodiment of FIG. 2A, first and second conductors 202a and 202b, respectively, are line or rail-shaped and extend in different directions (e.g., substantially perpendicular to one another). Other conductor shapes and/or configurations may be used. In some embodiments, barrier layers, adhesion layers, antireflection coatings and/or the like (not shown) may be used with first conductor 202a and/or second conductor 202b to improve device performance and/or aid in device fabrication.

Figure 2D:
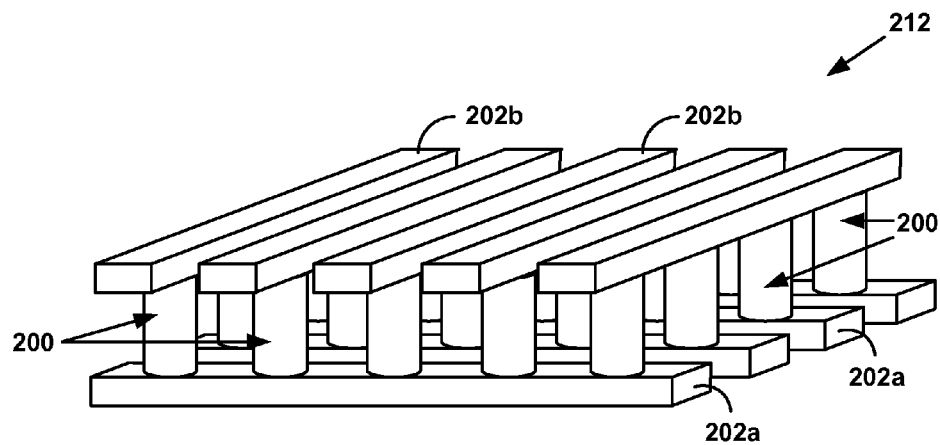
FIG. 2D is a simplified perspective view of a portion of a first memory level formed from a plurality of memory cells in accordance with this invention.

FIG. 2D is a simplified perspective view of a portion of a first memory level 212 formed from a plurality of memory cells 200, such as memory cells 200 of FIG. 2A or 2B. For simplicity, RRS material 104, conductive layers 106 and 108, additional layer(s) 110, diode 204, and barrier layers 206, 208 and 210 are not separately shown. Memory array 212 is a "cross-point" array including a plurality of bit lines (second conductors 202b) and word lines (first conductors 202a) to which multiple memory cells are coupled (as shown). Other memory array configurations may be used, as may multiple levels of memory.

Figure 2E:
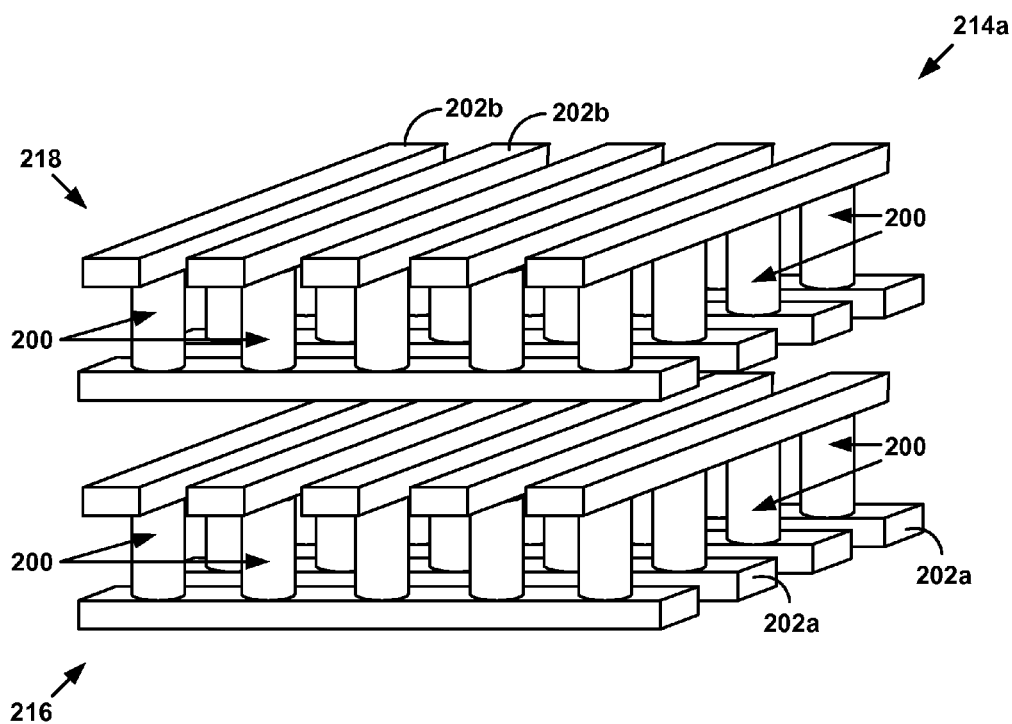
FIG. 2E is a simplified perspective view of a portion of a first monolithic three dimensional memory array that includes a first memory level positioned below a second memory level in accordance with the present invention.

FIG. 2E is a simplified perspective view of a portion of a monolithic three dimensional memory array 214a that includes a first memory level 216 positioned below a second memory level 218. Memory levels 216 and 218 each include a plurality of memory cells 200 in a cross-point array. Persons of ordinary skill in the art will understand that additional layers (e.g., an interlevel dielectric) may be present between first and second memory levels 216 and 218, but are not shown in FIG. 2E for simplicity. Other memory array configurations may be used, as may additional levels of memory.

In the embodiment of FIG. 2E, when a bipolar steering element such as a p-i-n diode is employed within each memory cell 200, all diodes may "point" in the same direction (have the same "steering element" polarity orientation), such as upward or downward depending on whether p-i-n diodes having a p-doped region on the bottom or top of the diodes are employed, simplifying diode fabrication. In accordance with the present invention, all bipolar MIM stacks 102 also may have the same polarity orientation across all memory levels in the memory array 214a of FIG. 2E. That is, each MIM stack 102 in the memory array 214a may be either positively oriented, such that a positive voltage is applied to each MIM stack 102's top electrode relative to its bottom electrode during a set operation, or negatively oriented, such that a negative voltage is applied to each MIM stack 102's top electrode relative to its bottom electrode during a set operation. This simplifies MIM stack fabrication.

Figure 2F:
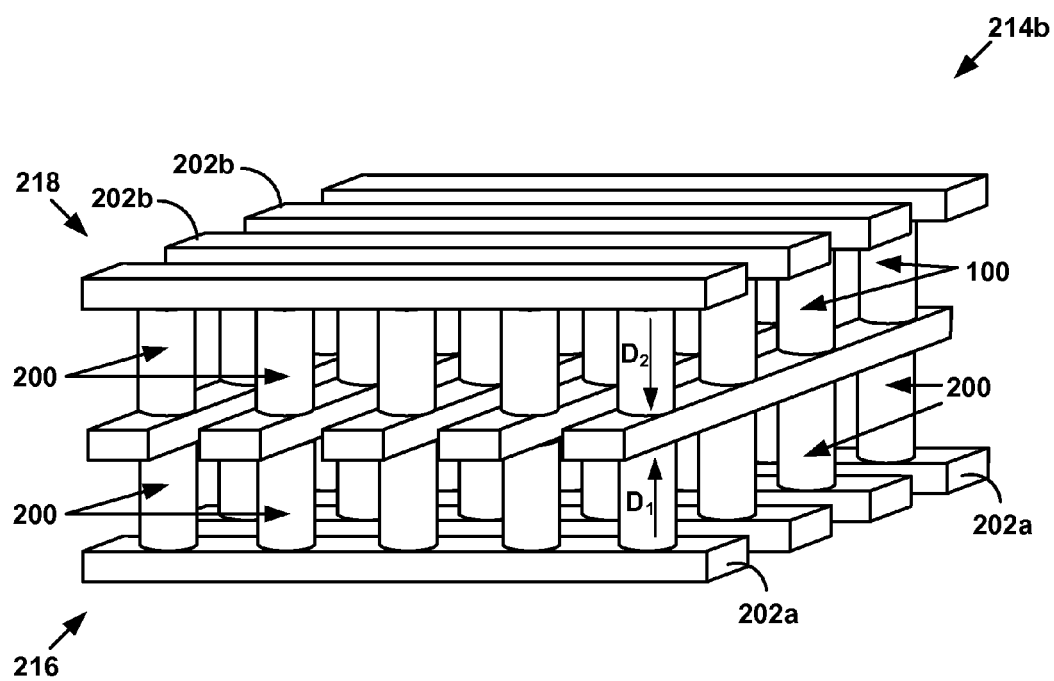
FIG. 2F is a simplified perspective view of a portion of a second monolithic three dimensional memory array that includes a first memory level positioned below a second memory level in accordance with the present invention.

In some embodiments, the memory levels may be formed as described in U.S. Pat. No. 6,952,030, titled "High-Density Three-Dimensional Memory Cell," which is hereby incorporated by reference herein in its entirety for all purposes. For instance, the second (top) conductors of a first memory level may be used as the first (bottom) conductors of a second memory level that is positioned above the first memory level as shown in FIG. 2F. In such embodiments, the diodes on adjacent memory levels preferably point in opposite directions as described in U.S. patent application Ser. No. 11/692,151, filed Mar. 27, 2007 and titled "Large Array Of Upward Pointing P-I-N Diodes Having Large And Uniform Current" (the "'151 Application"), which is hereby incorporated by reference herein in its entirety for all purposes. For example, as shown in memory array 214b in FIG. 2F, the diodes of first memory level 216 may be upward pointing diodes as indicated by arrow D1 (e.g., with p regions at the bottom of the diodes), whereas the diodes of second memory level 218 may be downward pointing diodes as indicated by arrow D2 (e.g., with n regions at the bottom of the diodes), or vice versa.

In accordance with the present invention, in embodiments in which conductors are shared between memory levels as in FIG. 2F, MIM stacks 102 are arranged to have the same voltage polarity orientation within a memory level, but opposite voltage polarity orientations between adjacent memory levels. For example, the MIM stacks 102 of first memory level 216 may be positively oriented whereas the MIM stacks 102 of the second memory level 218 may be negatively oriented, or vice versa. In some embodiments, the diodes 204 may be oriented to be reversed biased during the set operations of the MIM stacks 102. Alternatively, the diodes 204 may be oriented to be forward biased during the set operations of the MIM stacks 102.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Exemplary Stacked Memory Cells

FIG. 3A is a cross sectional view of a first memory cell stack 300a provided in accordance with the present invention. The memory cell stack 300a includes a first memory cell 200-1 and a second memory cell 200-2 formed above the first memory cell 200-1. As shown in FIG. 3A, the first and second memory cells 200-1 and 200-2 share a common word line 302 that serves as both the top conducting rail of the first memory cell 200-1 and the bottom conducting rail of the second memory cell 200-2. In other embodiments, the first and second memory cells 200-1 and 200-2 may share a bit line rather than a word line. Additional memory cells (not shown) may be provided at each memory level (e.g., to the left and/or right of the memory cells 200-1 and/or 200-2) as described in FIGS. 2D-F.

With reference to FIG. 3A, first memory cell 200-1 includes a first MIM stack 102-1 coupled in series with a first diode 204-1 between bit line 202a and word line 302. First MIM stack 102-1 has a positive polarity orientation such that a positive voltage applied to word line 302 relative to bit line 202a may be employed to set the first MIM stack 102-1. First diode 204-1 is oriented so as to be reversed biased during such a set operation. In other embodiments, first diode 204-1 may be oriented so as to be forward biased while a set operation is performed on the first MIM stack 102-1.

Second memory cell 200-2 includes a second MIM stack 102-2 coupled in series with a second diode 204-2 between word line 302 and bit line 202b. Second MIM stack 102-2 has a negative polarity orientation such that a positive voltage applied to word line 302 relative to bit line 202b may be employed to set the second MIM stack 102-2. Second diode 204-2 is oriented so as to be reversed biased during such a set operation. In other embodiments, second diode 204-2 may be oriented so as to be forward biased while a set operation is performed on the second MIM stack 102-2.

As can be seen from FIG. 3A, first MIM stack 102-1 has a first polarity orientation and second MIM stack 102-2 has a second, opposite polarity orientation relative to first MIM stack 102-1. Likewise, first diode 204-1 has a first polarity orientation and second diode 204-2 has a second, opposite polarity orientation relative to first diode 204-1.

First and second MIM stacks 102-1 and 102-2 may include any of the MIM stacks 102a-k previously described, or any other suitable MIM stack and/or bipolar storage element. In FIG. 3A, first and second MIM stacks 102-2 and 102-1 are shown as being similar to MIM stack 102h (FIG. 1J) and MIM stack 102j (FIG. 1L), respectively.

First and second diodes 204-1 and 204-2 may include any two terminal, non-linear steering element such as a p-n or p-i-n junction diode, a punch through diode, a tunneling oxide device, a Schottky diode, or the like. In FIG. 3A, first and second diodes 204-1 and 204-2 are shown as being p-i-n junction diodes. When bipolar steering elements are employed in a shared conductor embodiment such as that of FIG. 3A, the polarity of the diodes is alternated between memory levels as shown. However, when unipolar steering elements such as punch through diodes are employed, the diodes may be oriented the same between memory level as shown in the memory cell stack 300b of FIG. 3B.

With reference to FIG. 3A, the first memory cell 200-1 includes bit line 202a. Bit line 202a may be about 200 to about 2500 angstroms of any suitable conductive material such as tungsten or another appropriate metal, heavily doped semiconductor material, a conductive silicide, a conductive silicide-germanide, a conductive germanide, or the like. In some embodiments, a plurality of bit lines 202a (see for example, FIGS. 2D-F) may be formed as substantially parallel, substantially co-planar bit lines 202a. Exemplary widths for bit lines 202a and/or spacings between bit lines 202a range from about 200 to about 2500 angstroms, although other conductor widths and/or spacings may be used. Bit lines 202a may be separated from one another by dielectric material (not shown) such as silicon dioxide, silicon nitride, silicon oxynitride, low K dielectric, etc., and/or other dielectric materials.

Barrier layer 210 is formed over bit line 202a. Barrier layer 210 may be about 20 to about 500 angstroms, and preferably about 100 angstroms, of titanium nitride or another suitable barrier layer such as tantalum nitride, tungsten nitride, tungsten, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

Semiconductor material used to form the diode 204-1 is formed over barrier layer 210. In the embodiment of FIG. 3A, the diode 204-1 is formed from a polycrystalline semiconductor material such as polysilicon, a polycrystalline silicon-germanium alloy, polygermanium or any other suitable material. For example, a heavily doped amorphous or polycrystalline p+ silicon layer 204-1a may be deposited on barrier layer 210. CVD or another suitable process may be employed to deposit p+ silicon layer 204-1a. In at least one embodiment, p+ silicon layer 204-1a may be formed, for example, from about 100 to about 1000 angstroms, preferably about 100 angstroms, of p+ silicon with a doping concentration of about $10^{21}$ cm$^{-3}$. Other layer thicknesses and/or doping concentrations may be used. P+ silicon layer 204-1a may be doped in situ, for example, by flowing an acceptor gas during deposition, or ex situ, for example, via implantation.

After deposition of p+ silicon layer 204-1a, a lightly doped, intrinsic and/or unintentionally doped amorphous or polycrystalline silicon layer 204-1b may be formed over p+ silicon layer 204-1a. CVD or another suitable deposition method may be employed to deposit intrinsic silicon layer 204-1b. In at least one embodiment, intrinsic silicon layer 204-1b may be about 500 to about 4800 angstroms, preferably about 2500 angstroms, in thickness. Other intrinsic layer thicknesses may be used.

Additional silicon may be deposited and doped by ion implantation or doped in situ during deposition to form a n+ silicon layer 204-1c. Further, in some embodiments, a diffusion process may be employed. In at least one embodiment, the resultant n+ silicon layer 204-1c may have a thickness of about 100 to about 1000 angstroms, preferably about 100 angstroms, with a doping concentration of about $10^{21}$ cm$^{-3}$. Other layer thicknesses and/or doping concentrations may be used.

Following formation of n+ silicon layer 204-1c, a silicide-forming metal layer stack 206 may be deposited over n+ silicon layer 204-1c. Exemplary silicide-forming metals include sputter or otherwise deposited titanium or cobalt. In some embodiments, a silicide-forming metal layer stack 206 is formed from about 1-4 nanometers of titanium and about 15-25 nanometers of titanium nitride. Other silicide-forming metal layer materials and/or thicknesses may be used.

A rapid thermal anneal ("RTA") step may be performed to form a silicide region by reaction of silicide-forming metal such as Ti with n+ region 204-1c. In some embodiments, the RTA may be performed at about 540° C. for about 1 minute, to cause silicide-forming metal and the deposited silicon of diode 204 to interact to form a silicide layer, consuming all or a portion of the silicide-forming metal.

As described in U.S. Pat. No. 7,176,064, titled "Memory Cell Comprising A Semiconductor Junction Diode Crystallized Adjacent To A Silicide," which is hereby incorporated by reference herein in its entirety for all purposes, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., a silicide layer may enhance the crystalline structure of silicon diode 204-1 during annealing). Lower resistivity silicon thereby is provided. Similar results may be achieved for silicon-germanium alloy and/or germanium diodes.

Following formation of metal layer stack 206, bottom electrode 108-1 of MIM stack 102-1 may be formed. For example, the bottom electrode 108-1 may include heavily doped silicon such as n+ silicon or p+ silicon, heavily doped germanium, heavily doped silicon-germanium, etc. In the embodiment of FIG. 3A, the bottom electrode 108-1 may include n+ silicon having a thickness of about 10-100 nanometers, and in some embodiments about 20 nanometers. The doping concentration of the n+ silicon may be about $5 \times 10^{19}$-$5 \times 10^{21}$ atoms/cm$^3$ and in some embodiments about $2 \times 10^{20}$ atoms/cm$^3$. Other film thicknesses and/or doping concentrations may be used.

Following formation of the bottom electrode 108-1, RRS material 104-1 may be formed by atomic layer deposition (ALD) or another suitable method. For example, the RRS material 104-1 may include HfO$_X$, ZrO$_X$, NiO$_X$, TiO$_X$, TaO$_X$, NbO$_X$, Al$_X$O$_Y$ or another suitable switching material. In the embodiment of FIG. 3A, the RRS material 104-1 may include HfO$_X$ having a thickness of about 3-12 nanometers, and in some embodiments about 5 nanometers, with x being about 1.2-2.0 and in some embodiments about 1.7. Other thickness ranges and/or x values may be used.

Following formation of the RRS material 104-1, a metal/metal oxide layer stack 110-1 may be formed. The metal/metal oxide layer stack 110-1 may include, for example, Ti/TiO$_X$, Zr/ZrO$_X$, Ni/NiO$_X$, Al/Al$_X$O$_Y$, Ta/TaO$_X$, Nb/NbO$_X$, Hf/HfO$_X$ or another similar layer stack. In the embodiment shown, the metal/metal oxide layer stack 110-1 may include Ti layer 110b-1 having a thickness of about 0.5-10 nanometers, and in some embodiments about 4 nanometers and TiO$_X$ layer 110a-1 having a thickness of about 0.5-6 nanometers, and in some embodiments about 1 nanometer; and x may be about 1.2-2.0 and in some embodiments about 1.5. Other thicknesses and/or x values may be used.

The TiO$_X$ layer 110a-1 may be formed, for example, by depositing a layer of Ti over the HfO$_X$ layer 104-1 and then oxidizing the Ti to form the TiO$_X$ layer 110a-1. For example, a layer of Ti may be deposited via PVD and then oxidized in the same ALD chamber used to form the HfO$_X$ layer 104-1 (e.g., by not flowing the Hf precursor). The Ti layer 110b-1 may then be formed over the TiO$_X$ layer 110a-1.

Top electrode 106-1 is formed over Ti layer 110b-1. For example, top electrode 106-1 may include titanium nitride, tantalum nitride, tungsten nitride, combinations of the same, a metal/metal nitride stack such as Ti/TiN, Ta/TaN, W/WN or another similar barrier layer. In the embodiment shown, the top electrode 106-1 may include about 10-60 nanometers, and in some embodiments about 20 nanometers of TiN. Other layer thicknesses may be used. In some embodiments, n+ silicon layer 108-1, the HfO$_X$ layer 104-1, TiO$_X$ layer 110a-1, Ti Layer 110b-1 and/or TiN layer 106-1 may be formed in a single cluster tool (e.g., without breaking vacuum) to improve the interfaces between the various layers.

To etch the above described MIM stack and diode layers into a pillar structure 304 (as shown in FIG. 3A, but see also FIGS. 2A-2F), any suitable etch process may be used. In some embodiments, a hard mask process may be employed as follows:

(1) deposit a metal hard mask over the top TiN electrode 106-1, such as about 500-1000 angstroms of W;
(2) deposit an oxide hard mask over the metal hard mask, such as about 1000-2000 angstroms of Si$_X$O$_Y$;
(3) deposit a polysilicon hard mask over the oxide hard mask, such as about 500-2000 angstroms of polysilicon; and
(4) deposit photoresist over the polysilicon hard mask, such as about 1000-3000 angstroms of photoresist.

The photoresist layer then may be exposed and developed, and the polysilicon hard mask layer may be etched using, for example, HBr, Cl$_2$, O$_2$, and/or He in a suitable high-density plasma etch chamber. Following stripping (ashing) of the photoresist, the oxide hard mask may be etched through the patterned and etched polysilicon hard mask using, for example, C$_4$F$_6$, O$_2$, and Ar in a suitable medium-density plasma etch chamber. The metal hard mask may then be etched through the patterned and etched oxide hard mask using, for example, NF$_3$, Ar, N$_2$, Cl$_2$, He, and/or O$_2$ in a suitable high-density plasma etch chamber.

Thereafter, the TiN top electrode 106-1 may be etched using, for example, HBr, Cl$_2$, and/or He; the Ti/TiO$_X$ metal layer stack 110-1 may be etched using, for example, CF$_4$, Cl$_2$, He, and/or N$_2$; the HfO$_X$ RRS material 104-1 may be etched using, for example, HBr, Cl$_2$, He, and/or N$_2$; the n+ silicon bottom electrode 108-1 may be etched using, for example, HBr, Cl$_2$, He, O$_2$ and/or N$_2$; the Ti/TiN layer stack 206 may be etched using, for example, HBr, Cl$_2$, and/or He; the polysilicon diode 204-1 may be etched using, for example, HBr, Cl$_2$, He, O$_2$ and/or N$_2$; and the TiN layer 210 may be etched using, for example, HBr, Cl$_2$, and/or He. All of these etch processes may be performed, for example, in a suitable high-density plasma etch chamber. Other etch chemistries and/or processes may be employed.

The resulting pillar structure 304 may be surrounded by a suitable dielectric to isolate it from other similar pillar structures (not shown) on the same memory level. For example, approximately 200-7000 angstroms of silicon dioxide may be deposited and planarized using chemical mechanical polishing or an etchback process to remove excess dielectric material and form a planar surface for receiving word line 302.

Word line 302 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Other conductive layer materials may be used. For example, conductive material may be deposited and etched to form word line 302 (and other word lines not separately shown). In at least one embodiment, such word lines are substantially parallel, substantially coplanar conductors that extend in a different direction than bit line(s) 202a (as shown in FIG. 2F, for example).

Word line 302 may be isolated from other word lines via a suitable dielectric fill and etchback process. Thereafter, the second memory cell 200-2 may be formed over the word line 302 in a manner similar to that used to form the first memory cell 200-1.

Note that when forming the second memory cell 200-2, the metal/metal-oxide layer stack 110-2 is positioned below the RRS material 104-2. In such an embodiment, the metal/metal-oxide layer stack 110-2 may be formed, for example, by depositing a layer of metal, such as titanium, and then oxidizing a portion of the metal layer so as to form the metal oxide layer portion of the metal/metal-oxide layer stack next to the remaining (unoxidized) portion of the metal layer. That is, a portion of the metal layer may be oxidized, and the oxidized portion of the metal layer may serve as the metal-oxide layer 110a-2 of the metal/metal-oxide layer stack 110-2, and the unoxidized portion of the metal layer may serve as the metal layer 110b-2 of the metal/metal-oxide layer stack 110-2. The remainder of the second memory cell 200-2 then may be formed.

A shared conductor embodiment such as is shown in FIG. 3A, has a compact structure compared to a non-shared conductor architecture, and also employs a reduced number of masking steps.

Following formation of the memory cell stack 300a (and/or any additional memory cell layers/levels to be formed above memory cell stack 300a), the resultant structure may be annealed to crystallize the deposited semiconductor material of diodes 204-1 and 204-2 (and/or to form silicide regions by reaction of silicide-forming metal from layer 206 with silicon region(s) of the diodes 204-1 and 204-2). As stated, the lattice spacing of titanium silicide and cobalt silicide are close to that of silicon, and it appears that silicide layers may serve as "crystallization templates" or "seeds" for adjacent deposited silicon as the deposited silicon crystallizes (e.g., a silicide layer may enhance the crystalline structure of silicon diodes during annealing at temperatures of about 600-800° C.). Lower resistivity diode material thereby is provided. Similar results may be achieved for silicon-germanium alloy and/or germanium diodes.

Thus in at least one embodiment, a crystallization anneal may be performed for about 10 seconds to about 2 minutes in nitrogen at a temperature of about 600 to 800° C., and more preferably between about 650 and 750° C. Other annealing times, temperatures and/or environments may be used.

FIG. 3B is a cross sectional view of a second memory cell stack 300b provided in accordance with the present invention. The second memory cell stack 300b of FIG. 3B is similar to the first memory cell stack 300a of FIG. 3A, but employs unipolar steering elements in place of the bipolar steering elements employed by the first memory cell stack 300a. For example, the diodes 204-1 and 204-2 in FIG. 3B are punch through diodes rather than p-i-n junction diodes as are used in the memory cell stack 300a of FIG. 3A. Because the diodes 204-1 and 204-2 of memory cell stack 300b are unipolar, diodes 204-1 and 204-2 need not be inverted relative to one another when a shared conductor arrangement is employed. As stated, other steering elements may be used such as tunneling devices, Schottky diodes or the like.

FIG. 3C is a cross sectional view of a third memory cell stack 300c provided in accordance with the present invention. The third memory cell stack 300c of FIG. 3C is similar to the first memory cell stack 300a of FIG. 3A, but does not employ a shared word line. Rather, the memory cell 200-2 does not employ the word line of memory cell 200-1. Instead, the memory cell 200-2 employs a separate bit line 202a and a separate word line 202b as shown. Memory cell 200-2 is isolated from memory cell 200-1 by one or more interlevel dielectrics 306, which may include silicon oxide, silicon nitride or a similar dielectric.

In an embodiment such as that of FIG. 3C, the polarity orientation of the MIM stacks 102-1 and 102-2, as well as of the diodes 204-1 and 204-2, may be the same throughout the entire memory cell stack 300c.

FIG. 3D is a cross sectional view of a fourth memory cell stack 300d provided in accordance with the present invention. The fourth memory cell stack 300d of FIG. 3D is similar to the third memory cell stack 300c of FIG. 3C, but employs unipolar steering elements in place of the bipolar steering elements employed by the third memory cell stack 300c of FIG. 3C. For example, the diodes 204-1 and 204-2 in FIG. 3D are punch through diodes rather than p-i-n junction diodes as are used in the memory cell stack 300c of FIG. 3C.

FIG. 3E is a cross sectional view of a fifth memory cell stack 300e provided in accordance with the present invention. The fifth memory cell stack 300e of FIG. 3E is similar to the first memory cell stack 300a of FIG. 3A, but employs no steering element within each memory cell 200-1 and 200-2. In such an embodiment, steering elements remote from the memory cells 200-1 and/or 200-2 may be employed to limit current flow through the MIM stacks 102-1 and/or 102-2. Such a steering element may include, for example, a transistor, a diode, a tunneling device or any other suitable device.

FIG. 3F is a cross sectional view of a sixth memory cell stack 300f provided in accordance with the present invention. The sixth memory cell stack 300f of FIG. 3F is similar to the fifth memory cell stack 300e of FIG. 3E, but does not employ a shared word line. Rather, the memory cell 200-2 of memory cell stack 300f does not employ the word line of memory cell 200-1. Instead, the memory cell 200-2 of memory cell stack 300f employs a separate bit line 202a and a separate word line 202b as shown. Memory cell 200-2 of memory cell stack 300f is isolated from memory cell 200-1 by one or more interlevel dielectrics 306, which may include silicon oxide, silicon nitride or a similar dielectric.

Array lines may be shared between adjacent memory levels as described previously with reference to FIG. 2F and FIGS. 3A, 3B and 3E. Shared array lines may be either bit lines or word lines. In some embodiments and as described previously with reference to FIGS. 2F, 3A, 3B and 3E, the bottom most array line may be a bit line with a layer of memory cells above it, followed by a shared word line with a layer of memory cells above it, followed by a shared bit line with a layer of memory cells above it, etc., with the top most array line being a bit line. In other embodiments, the bottom and top most array lines may be word lines.

In some embodiments, lower IR drops may be achieved by spreading simultaneously selected bits to multiple memory levels. In this manner, bias may be memory level independent, simplifying memory control circuitry design, and reset and set operations may be performed on bits from multiple memory levels as described below with reference to FIGS. 4A-4C.

FIG. 4A is a schematic diagram of an exemplary three dimensional memory array 400 provided in accordance with the present invention. The memory array 400 is fully mirrored with array lines shared and MIM stacks and diodes alternating polarity orientation between adjacent memory levels.

Memory array 400 includes a plurality of memory levels 402a-n having shared word lines WL1 and WL2. Top memory level 402n includes bit lines BL1 and BL2, and bottom memory level 402a includes bit lines BL3 and BL4. Memory cells 406, 408, 410 and 412 are located in the top memory level 402n between WL1 and BL1, WL1 and BL2, WL2 and BL1, and WL2 and BL2, respectively. Each memory cell 406-412 includes a resistance-switchable MIM stack oriented to be set and a diode oriented to be reverse biased when a positive voltage polarity is applied between the memory cell's word line relative to its respective bit line (as shown).

Memory cells 414, 416, 418 and 420 are located in the bottom memory level 402a between WL1 and BL3, WL1 and BL4, WL2 and BL3, and WL2 and BL4, respectively. Each memory cell 414-420 includes a resistance-switchable MIM stack oriented to be set and a diode oriented to be reverse biased when a positive polarity voltage is applied between the memory cell's word line relative to its respective bit line (as shown).

Memory cells above and below a word line may be simultaneously reset or set. For example, FIG. 4B illustrates exemplary timing diagrams for resetting memory cells 410 and 418 simultaneously. With reference to FIG. 4B, at time t0, WL2 is pulled to ground (0 volts) from a reset voltage (Vr) (e.g., about 4 volts in some embodiments, although other reset voltages maybe used). WL1 is held at Vr and BL2 and BL4 are grounded.

At time t1, both BL1 and BL3 switch from ground to the reset voltage Vr. BL1 and BL3 remain at Vr until a time t2 when both return to ground. With WL2 at 0 and BL1 at Vr between times t1 and t2, the memory cell 410 is reset. Likewise, with WL2 at 0 and BL3 at Vr between times t1 and t2, the memory cell 418 is reset. Accordingly, both memory cells 410 and 418 may be reset simultaneously. At time t3, WL2 returns to Vr.

In some embodiments, the pulse width from t1 to t2 may be about 1 to 500 nanoseconds, and in some embodiments about 50 nanoseconds. Other pulse widths may be used.

FIG. 4C illustrates exemplary timing diagrams for setting memory cells 410 and 418 simultaneously. With reference to FIG. 4C, at time t0, WL2 switches to a set voltage (Vs) from ground. In some embodiments, Vs may be about 4 volts, although other set voltages may be used. WL1, BL2 and BL4 are grounded.

At time t1, both BL1 and BL3 switch from ground to −Vs. BL1 and BL3 remain at −Vs until a time t2 when both return to ground. With WL2 at Vs and BL1 at −Vs between times t1 and t2, the memory cell 410 is set. Likewise, with WL2 at Vs and BL3 at −Vs between times t1 and t2, the memory cell 418 is set. Accordingly, both memory cells 410 and 418 may be set simultaneously. At time t3, WL2 returns to ground.

In some embodiments, the pulse width from t1 to t2 may be about 1 to 500 nanoseconds, and in some embodiments about 50 nanoseconds. Other pulse widths may be used.

Simultaneous setting and/or resetting of memory cells on multiple memory levels provides higher bandwidth for the memory array 400.

Memory Cell Stacks Having Storage Elements and Steering Elements that Share Material Layers FIGS. 5A-5C illustrate cross sectional views of first exemplary memory cell stacks 200-1a, 200-1b and 200-1c in which storage elements and steering elements may share a material layer (as shown in FIGS. 5B-5C) in accordance with the present invention. For example, FIG. 5A illustrates the lower memory cell 200-1 of FIG. 3A (referred to as memory cell 200-1a in FIG. 5A) having steering element 204-1 (e.g., an n-i-p diode) coupled in series with storage element 102-1 (e.g., an MIM stack).

In general any suitable steering element such as an n-p, p-n, n-i-p, p-i-n, punch through, Schottky, other diode configuration or other similar device may be used for steering element 204-1. Any of the MIM stacks described herein may be employed for storage element 102-1 such as MIM stacks that employ TiN/Ti/TiO$_X$/HfO$_X$/n+ Si, TiN/Ti/HfO$_X$/n+Si, TiN/TiO$_X$/HfO$_X$/n+ Si, other metal, metal nitride, semiconductor and/or RRS materials, as well as any other suitable storage elements.

In some embodiments, the diode 204-1 may be referred to as the lower or "L0" diode. The MIM stack 102-1 may be referred to as the lower or "L0" MIM stack.

As seen in FIG. 5A, the memory cell 200-1a employs a first n+ Si layer 108-1 within MIM stack 102-1 and a second n+ Si layer 204-1c within diode 204-1, separated by intervening Ti/TiN layer 206 as previously described. In some embodiments of the invention, as shown in FIG. 5B, a memory cell 200-1b may be formed in which the Ti/TiN layer 206 is eliminated and a single n+ Si layer 108-1, 204-1c is used for both MIM stack 102-1 and diode 204-1. Such a device structure may simplify process flow, eliminating at least two deposition steps (for the Ti/TiN layer and/or second n+ Si layer) and one clean step (between n+ Si layer and Ti/TiN layer deposition), and reduce device cost.

In some embodiments, the n+ silicon layer 108-1, 204-1c may have a thickness of about 5-100 nanometers, and in some embodiments about 20 nanometers. The doping concentration of the n+ silicon layer 108-1, 204-1c may be about $5 \times 10^{19}$-$5 \times 10^{21}$ atoms/cm$^3$ and in some embodiments about $2 \times 10^{20}$ atoms/cm$^3$. Other film thicknesses and/or doping concentrations may be used.

As stated previously, a silicide such as titanium silicide or cobalt silicide, may be added to the top of a diode stack to enhance the crystalline structure of the diode (e.g., through use of an anneal at temperatures of about 600-800° C.). Lower resistivity diode material thereby may be provided. In accordance with some embodiments of the present invention, the memory cell 200-1b of FIG. 5B may be modified to include a TiSi$_X$ layer or TiO$_X$/TiSi$_X$ layer stack 502 formed above the diode 204-1 to improve the crystalline structure of the diode 204-1, as shown by memory cell 200-1c in FIG. 5C.

As shown in FIG. 5C, the silicide layer or layer stack 502 is positioned between the n+ Si layer 108-1, 204-1c and RRS layer 104-1 (e.g., HfO$_X$ layer 104-1). Such a layer may be formed, for example, by depositing a titanium layer over the n+ Si layer 108-1, 204-1c and converting the Ti to TiSi$_X$ during a silicidation anneal performed at about 540° C. to 650° C. for about 60 seconds. Other process times and/or temperatures may be used.

If the silicidation anneal is performed before the HfO$_X$ layer 104-1 is deposited, then a single TiSi$_X$ layer may be formed between the n+ Si layer 108-1, 204-1c and HfO$_X$ layer 104-1. However, if the silicidation anneal is performed after the HfO$_X$ layer 104-1 is deposited, then a dual layer of TiO$_X$/TiSi$_X$ may be formed between the n+ Si layer 108-1, 204-1c and HfO$_X$ layer 104-1.

In some embodiments, the TiO$_X$ layer may have a thickness of about 0.5 to 10 nanometers, in some embodiments about 1 nanometer, and an x value of about 1 to 2; and the TiSi$_X$ layer may have a thickness of about 1 to 10 nanometers, in some embodiments about 2 nanometers, and an x value of about 0.5 to 1.5. Other thicknesses and/or x values may be used.

The use of a TiSi$_X$ layer between the n+ Si layer 108-1, 204-1c and HfO$_X$ layer 104-1 may prevent the formation of a SiO$_X$ sub-layer on the n+ Si layer during formation of the HfO$_X$ layer. Such a SiO$_X$ layer may increase the forming voltage of the MIM stack 102-1. Additionally or alternatively, Ti from the TiSi$_X$ layer 502 may migrate into and dope the HfO$_X$ layer 104-1, advantageously reducing the set/reset voltage of the HfO$_X$ layer 104-1. Such advantages may be seen with other metal oxide RRS layers employed within the MIM stack 102-1 such as ZrO$_X$, NiO$_X$, TiO$_X$, TaO$_X$, NbO$_X$, Al$_X$O$_Y$, or another metal oxide (MO$_X$) layer. A cobalt silicide or other silicide layer may be similarly formed and/or employed.

FIGS. 6A-6C illustrate cross sectional views of second exemplary memory cell stacks 200-1d, 200-1e and 200-1f in which storage elements and steering elements may share a material layer (as shown in FIGS. 6B-6C) in accordance with the present invention. The memory cell stacks 200-1d, 200-1e and 200-1f of FIGS. 6A-6C are similar to the memory cell stacks 200-1a, 200-1b and 200-1c of FIGS. 5A-5C, but employ punch through diodes in place of the n-i-p diodes of memory cell stacks 200-1a, 200-1b and 200-1c of FIGS. 5A-5C. For example, FIG. 6A illustrates the lower memory cell 200-1 of FIG. 3B (referred to as memory cell 200-1d in FIG. 6A) having steering element 204-1 (e.g., an n-p-n punch through diode) coupled in series with storage element 102-1 (e.g., an MIM stack). Any of the MIM stacks described herein may be employed for MIM stack 102-1 such as MIM stacks that employ TiN/Ti/TiO$_X$/HfO$_X$/n+ Si, TiN/Ti/HfO$_X$/n+Si, TiN/TiO$_X$/HfO$_X$/n+ Si, other metal, metal nitride, semiconductor and/or RRS materials, as well as any other suitable storage elements.

In some embodiments of the invention, as shown in FIG. 6B, a memory cell 200-1e may be formed in which the Ti/TiN layer 206 is eliminated and a single n+ Si layer 108-1 is used for both MIM stack 102-1 and diode 204-1. As stated, such a device structure may simplify process flow, eliminating at least two deposition steps (for the Ti/TiN layer and/or second n+ Si layer) and one clean step (between n+ Si layer and Ti/TiN layer deposition), and reduce device cost.

In some embodiments, the n+ silicon layer 108-1 may have a thickness of about 5-100 nanometers, and in some embodiments about 20 nanometers. The doping concentration of the n+ silicon layer 108-1 may be about $5 \times 10^{19}$-$5 \times 10^{21}$ atoms/cm$^3$ and in some embodiments about $2 \times 10^{20}$ atoms/cm$^3$. Other film thicknesses and/or doping concentrations may be used.

As with the memory cell 200-1c of FIG. 5C, FIG. 6C illustrates a memory cell 200-1f which includes a TiSi$_X$ layer or TiO$_X$/TiSi$_X$ layer stack 502 formed above the diode 204-1 to improve the crystalline structure of the diode 204-1. For example, the silicide layer or layer stack 502 may be positioned between the n+ Si layer 108-1 and the HfO$_X$ layer 104-1. Such a layer may be formed, for example, by depositing a titanium layer over the n+ Si layer 108-1 and converting the Ti to TiSi$_X$ during a silicidation anneal performed at about 540° C. to 650° C. for about 60 seconds. If the silicidation anneal is performed after the HfO$_X$ layer 104-1 is deposited, then a dual layer of TiO$_X$/TiSi$_X$ may be formed between the n+ Si layer 108-1 and HfO$_X$ layer 104-1 (as previously described).

FIGS. 7A-7D illustrate cross sectional views of third exemplary memory cell stacks 200-2a, 200-2b, 200-2c and 200-2d in which storage elements and steering elements may share a material layer (as shown in FIGS. 7B-7D) in accordance with the present invention. For example, the memory cell stack 200-2a of FIG. 7A is similar to the upper memory cell 200-2 of FIG. 3A having steering element 204-2 (e.g., a p-i-n diode) coupled in series with storage element 102-2 (e.g., an MIM stack). However, in the memory cell stack 200-2a of FIG. 7A, the positions of the diode 204-2 and MIM stack 102-2 are reversed so that the first n+ layer 106-2 and second n+ layer 204-2c of the memory cell stack 200-2a are near one another. The Ti/TiN layer stack 206 also is split into a Ti layer 206a (positioned above diode 204-2) and a TiN layer 206b (positioned between the MIM stack 102-2 and diode 204-2) as shown.

In general any suitable steering element such as an n-p, p-n, n-i-p, p-i-n, punch through, Schottky, other diode configuration or other similar device may be used for steering element 204-2. Any of the MIM stacks described herein may be employed for storage element 102-2 such as MIM stacks that employ TiN/Ti/TiO$_X$/HfO$_X$/n+ Si, TiN/Ti/HfO$_X$/n+ Si, TiN/TiO$_X$/HfO$_X$/n+ Si, other metal, metal nitride, semiconductor and/or RRS materials, as well as any other suitable storage elements.

In some embodiments, the diode 204-2 may be referred to as the upper or "L1" diode. The MIM stack 102-2 may be referred to as the upper or "L1" MIM stack.

As seen in FIG. 7A, the memory cell 200-2a employs a first n+ Si layer 106-2 within MIM stack 102-2 and a second n+ Si layer 204-2c within diode 204-2, separated by intervening TiN layer 206b. In some embodiments of the invention, as shown in FIG. 7B, a memory cell 200-2b may be formed in which the TiN layer 206b is eliminated and a single n+ Si layer 106-2, 204-2c is used for both MIM stack 102-2 and diode 204-2. Such a device structure may simplify process flow, eliminating at least two deposition steps (for the TiN layer and/or second n+ Si layer) and one clean step (between n+ Si layer and TiN layer deposition), and reduce device cost.

In some embodiments, the n+ silicon layer 106-2, 204-2c may have a thickness of about 5-100 nanometers, and in some embodiments about 20 nanometers. The doping concentration of the n+ silicon layer 106-2, 204-2c may be about $5\times10^{19}$-$5\times10^{21}$ atoms/cm$^3$ and in some embodiments about $2\times10^{20}$ atoms/cm$^3$. Other film thicknesses and/or doping concentrations may be used.

Note that the presence of Ti layer 206a above p+ Si layer 204-2a of diode 204-2 allows a silicide layer (titanium silicide) to be formed at the top of the diode stack to enhance the crystalline structure of the diode 204-2 (e.g., through use of an anneal at temperatures of about 600-800° C.). Lower resistivity diode material thereby may be provided.

In accordance with some embodiments of the present invention, it may be desirable to leave the diode 204-2 below the MIM stack 102-2, as was shown in FIG. 3A. For example, FIG. 7C illustrates an example of a memory cell 200-2c that is similar to the memory cell 200-2 of FIG. 3A, with diode 204-2 below MIM stack 102-2, but with TiO$_X$ layer 110a-2, Ti layer 110b-2, TiN layer 108-2 and Ti/TiN layer stack 206 removed (see FIG. 3A versus FIG. 7C). In such an embodiment, the p+ Si layer 204-2a serves as both the bottom electrode of MIM stack 102-2 and the p+ region of diode 204-2, greatly reducing the overall memory cell stack height and simplifying process flow.

In some embodiments, the memory cell 200-2c of FIG. 7C may be modified to include a TiSi$_X$ layer or TiO$_X$/TiSi$_X$ layer stack 502 formed above the diode 204-2 to improve the crystalline structure of the diode 204-2, as shown by memory cell 200-2d in FIG. 7D.

As shown in FIG. 7D, the silicide layer or layer stack 502 is positioned between the p+ Si layer 204-2a and RRS layer 104-2 (e.g., HfO$_X$ layer 104-2). Such a layer may be formed, for example, by depositing a titanium layer over the p+ Si layer 204-2a and converting the Ti to TiSi$_X$ during a silicidation anneal performed at about 540° C. to 650° C. for about 60 seconds. Other process times and/or temperatures may be used.

If the silicidation anneal is performed before the HfO$_X$ layer 104-2 is deposited, then a single TiSi$_X$ layer may be formed between the p+ Si layer 204-2a and HfO$_X$ layer 104-2. However, if the silicidation anneal is performed after the HfO$_X$ layer 104-2 is deposited, then a dual layer of TiO$_X$/TiSi$_X$ may be formed between the p+ Si layer 204-2a and HfO$_X$ layer 104-2.

In some embodiments, the TiO$_X$ layer may have a thickness of about 0.5 to 10 nanometers, in some embodiments about 1 nanometer, and an x value of about 1 to 2; and the TiSi$_X$ layer may have a thickness of about 1 to 10 nanometers, in some embodiments about 2 nanometers, and an x value of about 0.5 to 1.5. Other thicknesses and/or x values may be used.

The use of a TiSi$_X$ layer between the p+ Si layer 204-2a and HfO$_X$ layer 104-2 may prevent the formation of a SiO$_X$ sublayer on the p+ Si layer during formation of the HfO$_X$ layer. As stated, such a SiO$_X$ layer may increase the forming voltage of the MIM stack 102-2. Additionally or alternatively, Ti from the TiSi$_X$ layer 502 may migrate into and dope the HfO$_X$ layer 104-2, advantageously reducing the set/reset voltage of the HfO$_X$ layer 104-2. Such advantages may be seen with other metal oxide RRS layers employed within the MIM stack 102-2 such as ZrO$_X$, NiO$_X$, TiO$_X$, TaO$_X$, NbO$_X$, Al$_X$O$_Y$, or another MO$_X$ layer. A cobalt silicide or other silicide layer may be similarly formed and/or employed.

FIGS. 8A-8D illustrate cross sectional views of fourth exemplary memory cell stacks 200-2e, 200-2f, 200-2g and 200-2h in which storage elements and steering elements may share a material layer (as shown in FIGS. 8B-8D) in accordance with the present invention. The memory cell stacks 200-2e, 200-2f, 200-2g and 200-2h of FIGS. 8A-8D are similar to the memory cell stacks 200-2a, 200-2b, 200-2c and 200-1D of FIGS. 7A-7D, but employ punch through diodes in place of the p-i-n diodes of memory cell stacks 200-2a, 200-2b, 200-2c and 200-2d of FIGS. 7A-7D.

The memory cell stack 200-2e of FIG. 8A is similar to the upper memory cell 200-2 of FIG. 3B having steering element 204-2 (e.g., an n-p-n punch through diode) coupled in series with storage element 102-2 (e.g., an MIM stack). However, in the memory cell stack 200-2e of FIG. 8A, the positions of the diode 204-2 and MIM stack 102-2 are reversed so that the first n+ layer 106-2 and second n+ layer from diode 204-2 of the memory cell 200-2e are near one another. The Ti/TiN layer stack 206 also is split into a Ti layer 206a (positioned above diode 204-2) and a TiN layer 206b (positioned between the MIM stack 102-2 and diode 204-2) as shown. Any of the MIM stacks described herein may be employed for MIM stack 102-2 such as MIM stacks that employ TiN/Ti/TiO$_X$/HfO$_X$/n+Si, TiN/Ti/HfO$_X$/n+Si, TiN/TiO$_X$/HfO$_X$/n+ Si, other metal, metal nitride, semiconductor and/or RRS materials, as well as any other suitable storage elements.

In some embodiments of the invention, as shown in FIG. 8B, a memory cell 200-2f may be formed in which the TiN layer 206b is removed and a single n+ Si layer 106-2 is used for both MIM stack 102-2 and diode 204-2. As stated, such a device structure may simplify process flow, eliminating at least two deposition steps (for the TiN layer and/or second n+ Si layer) and one clean step (between n+ Si layer and TiN layer deposition), and reduce device cost.

In some embodiments, the n+ silicon layer 106-2 may have a thickness of about 5-100 nanometers, and in some embodiments about 20 nanometers. The doping concentration of the n+ silicon layer 106-2 may be about $5 \times 10^{19}$-$5 \times 10^{21}$ atoms/cm$^3$ and in some embodiments about $2 \times 10^{20}$ atoms/cm$^3$. Other film thicknesses and/or doping concentrations may be used.

As in the embodiment of FIG. 7B, the presence of Ti layer 206a above the top n+ Si layer of diode 204-2 in FIG. 8B allows a silicide layer (titanium silicide) to be formed at the top of the diode stack to enhance the crystalline structure of the diode 204-2 (e.g., through use of an anneal at temperatures of about 600-800° C.). Lower resistivity diode material thereby may be provided.

In accordance with some embodiments of the present invention, it may be desirable to leave the diode 204-2 below the MIM stack 102-2, as was shown in FIG. 3B. For example, FIG. 8C illustrates an example of a memory cell 200-2g that is similar to the memory cell 200-2 of FIG. 3B, with diode 204-2 below MIM stack 102-2, but with TiO$_X$ layer 110a-2, Ti layer 110b-2, TiN layer 108-2 and Ti/TiN layer stack 206 removed. In such an embodiment, the top n+ Si layer of diode 204-2 also serves as the bottom electrode of MIM stack 102-2, greatly reducing the overall memory cell stack height and simplifying process flow.

In some embodiments, the memory cell 200-2g of FIG. 8C may be modified to include a TiSi$_X$ layer or TiO$_X$/TiSi$_X$ layer stack 502 formed above the diode 204-2 to improve the crystalline structure of the diode 204-2, as shown by memory cell 200-2h in FIG. 8D.

As shown in FIG. 8D, the silicide layer or layer stack 502 is positioned between the top n+ Si layer of diode 204-2 and RRS layer 104-2 (e.g., HfO$_X$ layer 104-2). Such a layer may be formed, for example, by depositing a titanium layer over the top n+ Si layer of diode 204-2 and converting the Ti to TiSi$_X$ during a silicidation anneal performed at about 540° C. to 650° C. for about 60 seconds. If the silicidation anneal is performed after the HfO$_X$ layer 104-2 is deposited, then a dual layer of TiO$_X$/TiSi$_X$ may be formed between the top n+ Si layer of diode 204-2 and HfO$_X$ layer 104-2.

Through use of the present invention, at least one material layer of a steering element may be shared with a storage element, memory cell stack height may be reduced and process flow may be simplified. Further, in some embodiments, use of such shared material layers within memory cells may provide a reduction in forming, set and/or reset voltages of the memory cells. In one particular embodiment of a memory cell similar to the memory cell 200-1e of FIG. 6B (without TiO$_X$ layer 110a-1), forming voltage of the memory cell dropped from about 14-15 volts to about 6-7 volts, set voltage dropped from about 10-11 volts to about 6-7 volts, and reset voltage dropped from about −12 volts to about −8 volts when compared to a similar memory cell without shared material layers.

Such voltage drops are merely exemplary and will depend significantly on material type, layer thicknesses, and the like. In general, however, reducing stack height of a memory cell appears to reduce the set and reset voltages of the memory cell.

The foregoing description discloses only exemplary embodiments of the invention. Modifications of the above disclosed apparatus and methods which fall within the scope of the invention will be readily apparent to those of ordinary skill in the art. For instance, while the present invention has been described primarily with reference to bipolar, metal oxide based storage elements, other bipolar storage elements, whether employing metal oxide switching materials or not, may be similarly employed within memory arrays with shared or separate conductors including, for example, chalcogenide-based storage elements (e.g., in MIM stacks), Pt/NiO$_X$/TiN MIM stacks, or the like.

Some carbon-based materials exhibit similar reversible resistivity switching properties such amorphous carbon containing nanocrystalline graphene (referred to herein as "graphitic carbon"), graphene, graphite, carbon nano-tubes, amorphous diamond-like carbon ("DLC"), silicon carbide, boron carbide and other crystalline forms of carbon, which may include secondary materials. Accordingly, the present invention may be used with bipolar MIM stacks using any of these resistivity switching materials.

Further, MIM stacks may be placed above or below steering elements within any memory cells.

In some embodiments of the invention, MIM stacks may be formed from an RRS material sandwiched between two conductive layers. The two conductive layers may be metal, metal nitride, heavily doped semiconductor, whether n+ or p+, combinations of metal, metal nitride and/or semiconductor, or the like. Exemplary metal conductive layers include titanium, tungsten and tantalum; and exemplary metal nitride conductive layers include titanium nitride, tungsten nitride and tantalum nitride. Other metal and/or metal nitrides may be used.

Accordingly, although the present invention has been disclosed in connection with exemplary embodiments thereof, it should be understood that other embodiments may fall within the spirit and scope of the invention, as defined by the following claims.

The invention claimed is:

1. A memory cell comprising:
   a storage element formed from a metal-insulator-metal (MIM) stack including:
   a first conductive layer;
   a reversible resistivity switching (RRS) layer formed above the first conductive layer; and
   a second conductive layer formed above the RRS layer, at least one of the first and second conductive layers comprising a first semiconductor material layer; and
   a steering element coupled to the storage element, the steering element formed from the first semiconductor material layer of the MIM stack and one or more additional material layers.

2. The memory cell of claim 1 wherein the first semiconductor material layer comprises n-type semiconductor material.

3. The memory cell of claim 2 wherein the first semiconductor material layer comprises n-type silicon.

4. The memory cell of claim 2 wherein the one or more additional material layers comprise undoped semiconductor material and p-type semiconductor material.

5. The memory cell of claim 2 wherein the one or more additional material layers comprise p-type semiconductor material and n-type semiconductor material.

6. The memory cell of claim 1 wherein the first semiconductor material layer comprises p-type semiconductor material.

7. The memory cell of claim 6 wherein the first semiconductor material layer comprises p-type silicon.

8. The memory cell of claim 6 wherein the one or more additional material layers comprise undoped semiconductor material and n-type semiconductor material.

9. The memory cell of claim 6 wherein the one or more additional material layers comprise n-type semiconductor material and p-type semiconductor material.

10. The memory cell of claim 1 wherein the MIM stack includes a silicide layer formed between the RRS layer and the first semiconductor material layer.

11. The memory cell of claim 10 wherein the silicide layer comprises titanium silicide.

12. The memory cell of claim 11 further comprising a titanium oxide layer formed between the RRS layer and the first semiconductor layer.

13. The memory cell of claim 1 wherein the RRS layer comprises $HfO_X$, $ZrO_X$, $NiO_X$, $TiO_X$, $TaO_X$, $NbO_X$ or $Al_XO_Y$.

14. The memory cell of claim 1 wherein one of the first and second conductive layers comprises heavily doped semiconductor and the other of the first and second conductive layers comprises metal or metal nitride.

15. The memory cell of claim 14 wherein the metal or metal nitride comprises titanium, titanium nitride, tungsten, tungsten nitride, tantalum or tantalum nitride.

16. The memory cell of claim 1 further comprising a metal/metal-oxide layer stack formed between the first and second conductive layers of the MIM stack.

17. The memory cell of claim 16 wherein the metal/metal-oxide layer stack comprises $Ti/TiO_X$, $Zr/ZrO_X$, $Ni/NiO_X$, $Al/Al_XO_Y$, $Ta/TaO_X$, $Nb/NbO_X$, or $Hf/HfO_X$.

18. The memory cell of claim 16 wherein the metal/metal-oxide layer stack includes a metal-oxide layer and a metal layer, the metal-oxide layer positioned adjacent and between the RRS layer and the metal layer.

19. The memory cell of claim 18 wherein the metal layer of the metal/metal-oxide layer stack comprises a plurality of metal-rich regions separated by metal oxide.

20. The memory cell of claim 1 wherein the steering element comprises a vertical polycrystalline diode.

21. The memory cell of claim 1 wherein the steering element comprises a punch through diode or a p-i-n junction diode.

22. A memory cell comprising:
a storage element formed from a metal-insulator-metal (MIM) stack; and
a steering element coupled to the storage element, the storage element and steering element sharing at least one layer,
wherein the MIM stack includes:
a first conductive layer;
a reversible resistivity switching (RRS) layer formed above the first conductive layer; and
a second conductive layer formed above the RRS layer, at least one of the first and second conductive layers comprising a first semiconductor material layer; and
the steering element is formed from the first semiconductor material layer of the MIM stack and one or more additional material layers.

23. The memory cell of claim 22 wherein the first semiconductor material layer comprises n-type semiconductor material.

24. The memory cell of claim 23 wherein the first semiconductor material layer comprises n-type silicon.

25. The memory cell of claim 23 wherein the one or more additional material layers comprise undoped semiconductor material and p-type semiconductor material.

26. The memory cell of claim 23 wherein the one or more additional material layers comprise p-type semiconductor material and n-type semiconductor material.

27. The memory cell of claim 22 wherein the first semiconductor material layer comprises p-type semiconductor material.

28. The memory cell of claim 27 wherein the one or more additional material layers comprise undoped semiconductor material and n-type semiconductor material.

29. The memory cell of claim 27 wherein the one or more additional material layers comprise n-type semiconductor material and p-type semiconductor material.

30. The memory cell of claim 22 wherein the MIM stack includes a silicide layer formed between the RRS layer and the first semiconductor material layer.

31. A method of forming a memory cell comprising:
forming a storage element by:
forming a first conductive layer above a substrate;
forming a reversible resistivity switching (RRS) layer above the first conductive layer; and
forming a second conductive layer above the RRS layer, at least one of the first and second conductive layers comprising a first semiconductor material layer; and
forming a steering element coupled to the storage element, the steering element formed from the first semiconductor material layer of the storage element and one or more additional material layers.

32. The method of claim 31 wherein the first semiconductor material layer comprises n-type semiconductor material.

33. The method of claim 32 wherein the first semiconductor material layer comprises n-type silicon.

34. The method of claim 32 wherein the one or more additional material layers comprise undoped semiconductor material and p-type semiconductor material.

35. The method of claim 32 wherein the one or more additional material layers comprise p-type semiconductor material and n-type semiconductor material.

36. The method of claim 31 wherein the first semiconductor material layer comprises p-type semiconductor material.

37. The method of claim 36 wherein the one or more additional material layers comprise undoped semiconductor material and n-type semiconductor material.

38. The method of claim 36 wherein the one or more additional material layers comprise n-type semiconductor material and p-type semiconductor material.

39. The method of claim 31 wherein forming the MIM stack includes forming a silicide layer between the RRS layer and the first semiconductor material layer.

40. The method of claim 39 wherein the silicide layer comprises titanium silicide.

41. The method of claim 40 further comprising forming a titanium oxide layer between the RRS layer and the first semiconductor layer.

42. The method of claim 31 wherein the RRS layer comprises $HfO_X$, $ZrO_X$, $NiO_X$, $TiO_X$, $TaO_X$, $NbO_X$ or $Al_XO_Y$.

43. The method of claim 31 wherein one of the first and second conductive layers comprises heavily doped semiconductor and the other of the first and second conductive layers comprises metal or metal nitride.

44. The method of claim 43 wherein the metal nitride comprises titanium, titanium nitride, tungsten, tungsten nitride, tantalum or tantalum nitride.

45. The method of claim 31 further comprising forming a metal/metal-oxide layer stack between the first and second conductive layers of the MIM stack.

46. The method of claim 45 wherein the metal/metal-oxide layer stack comprises Ti/TiO$_X$, Zr/ZrO$_X$, Ni/NiO$_X$, Al/Al$_X$O$_Y$, Ta/TaO$_X$, Nb/NbO$_X$, or Hf/HfO$_X$.

47. The method of claim 45 wherein the metal/metal-oxide layer stack includes a metal-oxide layer and a metal layer, the metal-oxide layer positioned adjacent and between the RRS layer and the metal layer.

48. The method of claim 47 wherein the metal layer of the metal/metal-oxide layer stack comprises a plurality of metal-rich regions separated by metal oxide.

49. The method of claim 31 wherein the steering element comprises a vertical polycrystalline diode.

50. The method of claim 31 wherein the steering element comprises a punch through diode or a p-i-n junction diode.

51. A storage element formed by the method of claim 31.

* * * * *